US011830507B2

(12) United States Patent
Biswas et al.

(10) Patent No.: US 11,830,507 B2
(45) Date of Patent: Nov. 28, 2023

(54) CODING DENSE TRANSIENT EVENTS WITH COMPANDING

(71) Applicant: Dolby International AB, Amsterdam Zuidoost (NL)

(72) Inventors: Arijit Biswas, Schwaig bei Nuernberg (DE); Harald Mundt, Fürth (DE)

(73) Assignee: Dolby International AB, Dublin (IE)

( * ) Notice: Subject to any disclaimer, the term of this patent is extended or adjusted under 35 U.S.C. 154(b) by 195 days.

(21) Appl. No.: 17/270,035

(22) PCT Filed: Aug. 21, 2019

(86) PCT No.: PCT/EP2019/072377
§ 371 (c)(1),
(2) Date: Feb. 21, 2021

(87) PCT Pub. No.: WO2020/039000
PCT Pub. Date: Feb. 27, 2020

(65) Prior Publication Data
US 2022/0270624 A1    Aug. 25, 2022

Related U.S. Application Data

(60) Provisional application No. 62/720,447, filed on Aug. 21, 2018.

(51) Int. Cl.
*G10L 19/025*        (2013.01)
*G10L 19/00*         (2013.01)
(Continued)

(52) U.S. Cl.
CPC ............ *G10L 19/025* (2013.01); *G10L 19/00* (2013.01); *G10L 19/167* (2013.01);
(Continued)

(58) Field of Classification Search
None
See application file for complete search history.

(56) References Cited

U.S. PATENT DOCUMENTS 8,085,943 B2    12/2011    Bizjak
8,392,201 B2     3/2013    Noh
(Continued)

FOREIGN PATENT DOCUMENTS

EP    1852851 A1    11/2007
EP    1873753 A1     1/2008
(Continued)

OTHER PUBLICATIONS

Daudet, Laurent "A Review on Techniques for the Extraction of Transients in Musical Signals" Big Data Analytics in the Social and Ubiquitous Context: 5th International Workshop on Modeling Social Media, Sep. 26, 2005.

*Primary Examiner* — Richa Mishra

(57) ABSTRACT

Embodiments are directed to a companding method and system for reducing coding noise in an audio codec. A method of processing an audio signal includes the following operations. A system receives an audio signal. The system determines that a first frame of the audio signal includes a sparse transient signal. The system determines that a second frame of the audio signal includes a dense transient signal. The system compresses/expands (compands) the audio signal using a companding rule that applies a first companding exponent to the first frame of the audio signal and applies a second companding exponent to the second frame of the audio signal, each companding exponent being used to derive a respective degree of dynamic range compression and expansion for a corresponding frame. The system then provides the companded audio signal to a downstream device.

6 Claims, 15 Drawing Sheets

(51) Int. Cl.
*G10L 19/16* (2013.01)
*G10L 21/0316* (2013.01)
*G10L 21/04* (2013.01)
*H03M 7/50* (2006.01)
*H03M 7/30* (2006.01)

(52) U.S. Cl.
CPC .......... *G10L 21/0316* (2013.01); *G10L 21/04* (2013.01); *H03M 7/50* (2013.01); *H03M 7/3059* (2013.01)

(56) References Cited

U.S. PATENT DOCUMENTS

| | | |
|---|---|---|
| 8,548,614 B2 | 10/2013 | Kirkeby |
| 9,654,876 B2 | 5/2017 | Neely |
| 9,735,800 B2 | 8/2017 | Pagnanelli |
| 2011/0257979 A1 | 10/2011 | Gao |
| 2011/0257984 A1 | 10/2011 | Virette |
| 2015/0332683 A1 * | 11/2015 | Kim ................ G10L 19/008 704/500 |
| 2018/0082692 A1 | 3/2018 | Khoury |
| 2018/0190303 A1 * | 7/2018 | Ghido ................ G10L 19/26 |
| 2018/0358028 A1 | 12/2018 | Biswas |

FOREIGN PATENT DOCUMENTS

| | | | |
|---|---|---|---|
| JP | 2016510439 A | 4/2016 | |
| WO | WO-2014165543 A1 * | 10/2014 | .......... G10L 19/008 |
| WO | 2017080835 W | 5/2017 | |
| WO | WO-2017080835 A1 * | 5/2017 | ............. G10L 19/20 |
| WO | 2017140600 W | 8/2017 | |

\* cited by examiner

| α values | Companding status | Comments |
|---|---|---|
| | OFF | No companding is applied. Indirectly, this means α = 1. |
| α = 0.65 | ON | Current status in AC-4. Fixed α = 0.65 in AC-4 encoder and decoder. |
| α = 0.5 | ON | Proposed addition |
| α = 0.35 | ON | Proposed addition |

FIG. 11

CODING DENSE TRANSIENT EVENTS WITH COMPANDING

CROSS-REFERENCE TO RELATED APPLICATION

This application claims priority of the following priority application: U.S. provisional application 62/720,447 (reference: D18075USP1), filed 21 Aug. 2018, which is hereby incorporated by reference.

FIELD OF THE INVENTION

One or more embodiments relate generally to audio signal processing, and more specifically to optimally using compression/expansion (companding) techniques in a signal-dependent manner during digital audio encoding.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Many popular digital sound formats utilize lossy data compression techniques that discard some of the data to reduce storage or data rate requirements. The application of lossy data compression not only reduces the fidelity of source content (e.g., audio content), but it can also introduce noticeable distortion in the form of compression artifacts. In the context of audio coding systems, these sound artifacts are called coding noise or quantization noise. Digital audio systems employ codecs (coder-decoder components) to compress and decompress audio data according to a defined audio file format or streaming media audio format. Codecs implement algorithms that attempt to represent the audio signal with a minimum number of bits while retaining as high fidelity as possible. The lossy compression techniques typically used in audio codecs work on a psychoacoustic model of human hearing perception. The audio formats usually involve the use of a time/frequency domain transform (e.g., a modified discrete cosine transform—MDCT), and use masking effects, such as frequency masking or temporal masking so that certain sounds, including any apparent quantization noise is hidden or masked by actual content.

As is known, audio codecs normally shape the coding noise in the frequency domain so that it becomes least audible. In frame-based encoders, coding noise may be most audible during low intensity parts of the frame, and may be heard as pre-echo distortion in which silence (or low-level signal) preceding a high intensity segment is swamped by noise in the decoded audio signal. Such an effect may be most noticeable in transient sounds or impulses from percussion instruments, such as castanets or other sharp percussive sound sources, and is typically caused by the quantization noise introduced in the frequency domain being spread over the entire transform window of the codec in the time domain.

Although filters have been used to minimize pre-echo artifacts, such filters usually introduce phase distortion and temporal smearing. The use of smaller transform windows has also been an approach, but this can significantly reduce frequency resolution and usage of multiple smaller transform windows within a frame increases the "side-info" bit rate.

One system has been developed to overcome the effects of pre-echo artifacts through the use of companding techniques to achieve temporal noise shaping of quantization noise in an audio codec. Such embodiments include the use of a companding algorithm implemented in the QMF-domain to achieve temporal shaping of quantization noise in conjunction with a masking threshold computation strategy. However, it is generally not straightforward to guess the type of companding that needs to be applied for a particular signal type. In general, companding provides benefits in time-domain (temporal) noise shaping, but it can also often provide beneficial in frequency-domain noise shaping. However, computing the masking threshold along with a threshold reduction strategy for satisfying bit-rate constraints is a highly non-linear operation and it is difficult to predict the final outcome of the frequency-domain noise shaping. Because of this, as well as the inherent non-linear operation of companding, it is extremely difficult to predict the type of companding that needs to be applied in a content-dependent manner. Through certain data collection efforts, it has been found that companding is advantageous for audio content that is exclusively or primarily comprised of speech or applause. While it is possible to design a detector that functions independently for speech and applause, it is not straightforward to design a simple detector featuring low-complexity and without any delay that is able to detect both speech and applause. Furthermore, present detectors are not always 100% accurate.

What is needed, therefore, is a signal-dependent companding system that can adaptively apply companding based on the input signal content. What is further needed is a detector circuit that can better discriminate between speech/applause and more tonal audio content for appropriately applying companding for complicated audio signals.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are directed to a method of processing an audio signal by receiving an audio signal, classifying the audio signal as one of pure sinusoidal, hybrid, or pure transient signal using two defined threshold values, and applying a selective companding (compression/expansion) operation to a classified hybrid signal using a companding rule that uses a temporal sharpness measure in a quadrature modulated filter (QMF) domain. The selective companding operation comprises one of: a companding off mode, a companding on mode, and an average companding mode. The average companding mode is derived by measuring gain factors of each frame of a plurality of frames of the audio signal, and applying a constant gain factor to the each frame, wherein the gain factor is closer to a gain factor of an adjacent frame for a companding on mode than a gain factor of 1.0 of the adjacent frame for a companding off mode. The method may further comprise calculating the gain factor by averaging mean absolute energy levels over a plurality of time slots in one frame. For a classified hybrid signal, the selective companding operation comprises one of: a companding on mode and an average companding mode.

In an embodiment, the method further comprises turning companding off for a classified pure sinusoidal signal, and turning companding on for a classified pure transient signal. The classified hybrid signal may include applause or speech content. The companding rule may further use a spectral sharpness measure in the quadrature modulated filter (QMF) domain. In an embodiment, the method further comprises generating control information encoding the selective companding operation, and transmitting the control information in a bitstream that is transmitted with digital audio output from an audio encoder to an audio decoder. The classified hybrid signal comprises at least a combination of partial sinusoidal and partial transient signals, and is further processed to distinguish the partial sinusoidal and partial transient signals to apply the selective companding operation based on a predominant component of the hybrid signal so as to provide continuity in the gain applied in the compression and reduce audio distortion caused by switching artifacts. The companding rule uses a first measure based on a number of frequency bands with a temporal sharpness greater than a first threshold number, and a second measure based on a mean of temporal sharpness values less than the first threshold number.

Embodiments are further directed to a system comprising an encoder applying compression to modify quadrature modulated filter (QMF) time slots by broadband gain values, wherein a gain value is large resulting in amplification for slots of relatively low intensity or small resulting in attenuation for slots of relatively high intensity, an interface to transmit audio output from the encoder to a decoder that is configured to apply expansion to reverse the compression in a companding operation, and a companding controller having a detector configured receive an input audio signal and classify the input audio signal based on signal characteristics, and a switch configured to switch among a plurality of companding modes based on the classified input audio signal.

Embodiments are yet further directed to an audio decoder comprising a first interface receiving an encoded compressed audio signal from an encoder applying compression to modify quadrature modulated filter (QMF) time slots by broadband gain values, wherein a gain value is large resulting in amplification for slots of relatively low intensity or small resulting in attenuation for slots of relatively high intensity, an expander component applying expansion to reverse the compression in a companding operation, and a second interface receiving a bitstream encoding a companding control mode from a controller classifying the input audio signal based on signal characteristics, and switching among a plurality of companding modes based on the classified input audio signal.

Further embodiments are directed to a method, system, device, and non-transient computer-readable medium storing instructions configured to process an audio signal. In one embodiment, an audio is received. For a time segment (e.g., frame) of the audio signal, the time segment of the audio signal is analyzed to determine whether the time segment of the audio signal includes a sparse transient signal or a dense transient signal. The time segment of the audio signal is companded (dynamic range compressed or expanded) based on a result of the determination. The companded time segment of the audio signal is output. Therein, companding the time segment of the audio signal comprises compressing or expanding a dynamic range of the time segment of the audio signal based on a companding exponent. A first companding exponent is used in the companding if it is determined that the time segment of the audio signal includes the sparse transient signal (e.g., includes a first transient type of signal). A second companding exponent that is different from the first companding exponent is used in the companding if it is determined that the time segment of the audio signal includes the dense transient signal (e.g., includes a second transient type of signal).

According to a further embodiment, a system receives an audio signal. The system determines that a first frame of the audio signal includes a sparse transient signal (e.g., a first transient type of signal). The system determines that a second frame of the audio signal includes a dense transient signal (e.g., a second transient type of signal). The system applies a compression/expansion (companding) operation to the audio signal using a companding rule that applies a first companding exponent to the first frame of the audio signal and applies a second companding exponent to the second frame of the audio signal. Each companding exponent is used to derive a respective degree of dynamic range compression for a corresponding frame. The system then provides the companded audio signal, as well as the respective companding exponents, to a downstream device for consumption.

The techniques disclosed in this specification can be implemented to achieve one or more advantages over conventional audio processing techniques. For example, conventionally, the focus of the companding tool was to improve the speech quality at low bitrates. As a result, a fixed companding exponent of $\alpha=0.65$ in the companding tool was used after tuning with speech and was standardized. The companding exponent of $\alpha=0.65$ also seemed to improve applause. The techniques disclosed in this specification improve upon the conventional techniques by improving "hard to code" dense transient signals, e.g., applause, fire crackling, or rain. By selecting different values for the companding exponent based on transient types of content, the disclosed techniques can produce better quality sound for those dense transient signals.

The disclosed techniques add minimal overhead in audio encoding. As described in greater detail below, the disclosed techniques can improve sound of transient type content by adding only one bit in a companding control data structure in an audio compression encoding scheme, e.g., the Digital Audio Compression (AC-4) standard. Accordingly, the disclosed techniques are simple and efficient.

Embodiments are yet further directed to methods of making and using or deploying the circuits and designs that embody or implement the signal-dependent companding system that may be used as part of an encoder, decoder or combined encoder/decoder system.

INCORPORATION BY REFERENCE

Each technical specification, publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

In the following drawings like reference numbers are used to refer to like elements. Although the following figures depict various examples, the one or more implementations are not limited to the examples depicted in the figures.

FIG. 11 is a table indicating example values of a companding exponent and corresponding companding status.

DETAILED DESCRIPTION

Systems and methods are described for the use of certain improvements to companding techniques to achieve temporal noise shaping of quantization noise in an audio codec through the use of a companding algorithm implemented in the QMF-domain to achieve temporal shaping of quantization noise. Embodiments include a detector to signal content (e.g., speech and applause) within audio content and apply an appropriate type or amount of companding based on the detected content, thus providing optimal companding in a signal-dependent manner.

Aspects of the one or more embodiments described herein may be implemented in an audio system that processes audio signals for transmission across a network that includes one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Figure 1:
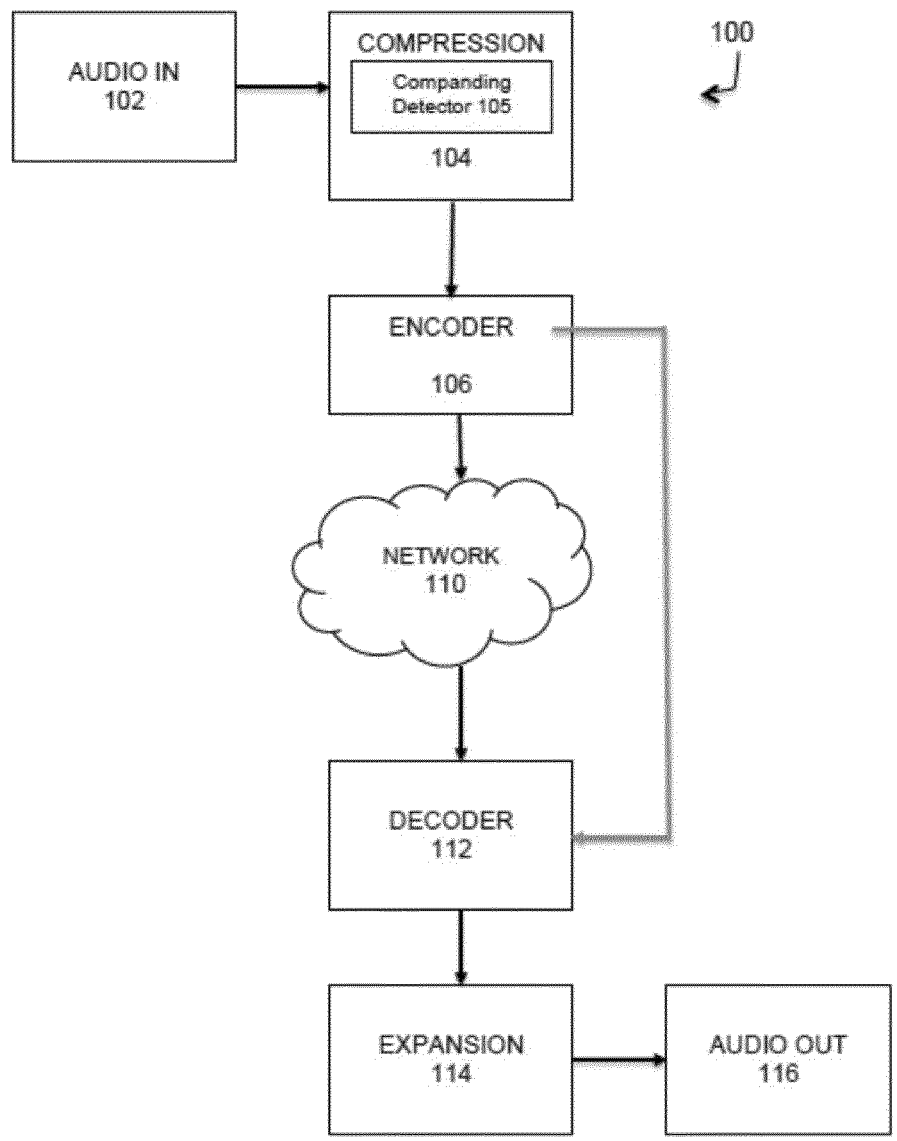
FIG. 1 illustrates a companding system for reducing quantization noise in a codec-based audio processing system that may be used with a content detector, under some embodiments.

FIG. 1 illustrates a companding system for reducing quantization noise in a codec-based audio processing system that may be used with a content detector, under some embodiments. FIG. 1 illustrates an audio signal processing system that is built around an audio codec comprising encoder (or "core encoder") 106 and decoder (or "core decoder") 112. The encoder 106 encodes audio content into data stream or signal for transmission over network 110 where it is decoded by decoder 112 for playback or further processing. In an embodiment, the encoder 106 and decoder 112 of the codec implement a lossy compression method to reduce the storage and/or data rate requirements of the digital audio data, and such a codec may be implemented as a MP3, Vorbis, Dolby Digital (AC-3 or AC-4), AAC, or similar codec. The lossy compression method of the codec creates coding noise that generally is stationary in level over the evolution of a frame defined by the codec. Such coding noise is often most audible during low intensity parts of a frame. System 100 includes components that reduce the perceived coding noise in existing coding systems by providing a compression pre-step component 104 prior to the core encoder 106 of the codec and an expansion post-step component 114 operating on the core decoder 112 output. The compression component 104 is configured to divide the original audio input signal 102 into a plurality of time segments using a defined window shape, calculate and apply a wideband gain in the frequency domain using a non-energy based average of frequency domain samples of the initial audio signal, wherein the gain values applied to each time segment amplify segments of relatively low intensity and attenuate segments of relatively high intensity. This gain modification has the effect of compressing or significantly reducing the original dynamic range of the input audio signal 102. The compressed audio signal is then coded in encoder 106, transmitted over network 110 and decoded in decoder 112. The decoded compressed signal is input to expansion component 114, which is configured to perform the inverse operation of the compression pre-step 104 by applying inverse gain values to each time segment to expand the dynamic range of the compressed audio signal back to the dynamic range of the original input audio signal 102. Thus, the audio output signal 116 comprises an audio signal having the original dynamic range, with the coding noise removed through the pre- and post-step companding process.

System 100 performs compression and expanding (companding) in the QMF-domain to achieve temporal shaping of quantization noise of a digital coder (that is either an audio or speech spectral frontend) quantization noise. The encoder may be a Dolby Digital AC-3 or AC-4 core coder, or any other similar system. It performs certain pre-processing functions comprising compression prior to the core encoder; and post-processing functions comprising expansion of the core decoder output that exactly performs the inverse operation of the pre-processing. The system includes signal-dependent encoder control of the desired decoder companding level, and a signal-dependent stereo (and multi-channel) companding process. As shown in FIG. 1, the encoder 106 encoder, and compression component 104 includes a companding detector 105 that detects a state of a companding decision. A companding on/off/averaging decision is detected in the encoder 106 and transmitted to the decoder 112 so that that the compressor and expander are able to be switched on/off/averaged at the same QMF time slot, where the QMF time slot processing is described in greater detail below.

As further shown in FIG. 1, a compression component or compression pre-step 104 is configured to reduce the dynamic range of the audio signal 102 input to the core encoder 106. The input audio signal is divided into a number of short segments. The size or length of each short segment is a fraction of the frame size used by the core encoder 106. For example, a typical frame size of the core coder may be on the order of 40 to 80 milliseconds. In this case, each short segment may be on the order of 1 to 3 milliseconds. The compression component 104 calculates an appropriate wideband gain value to compress the input audio signal on a per-segment basis. This is achieved by modifying short segments of the signal by an appropriate gain value for each segment. Relatively large gain values are selected to amplify segments of relatively low intensity, and small gain values are selected to attenuate segments of high intensity.

Figure 2A:
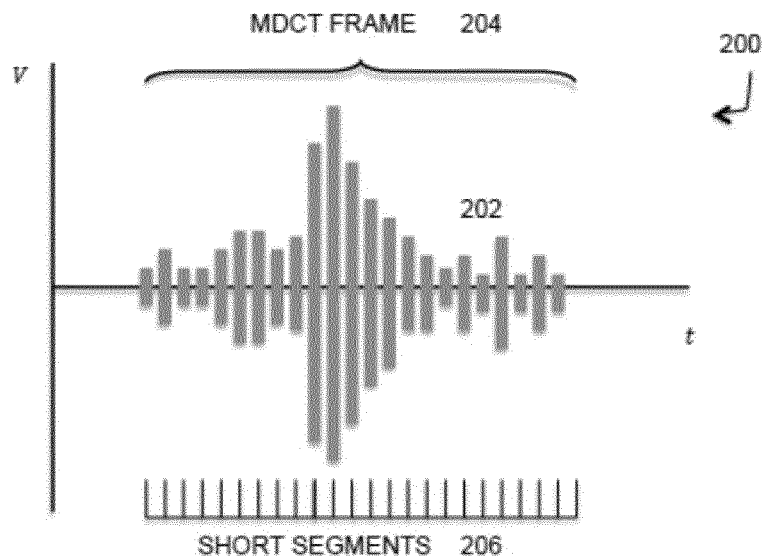
FIG. 2A illustrates an audio signal divided into a plurality of short time segments, under an embodiment.
Figure 2B:
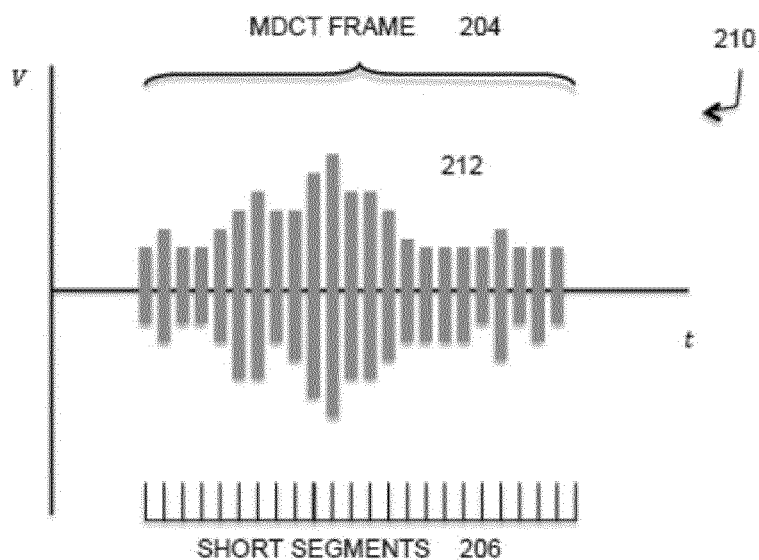
FIG. 2B illustrates the audio signal of FIG. 2A after the application of wideband gain over each of the short time segments, under an embodiment.

FIG. 2A illustrates an audio signal divided into a plurality of short time segments, under an embodiment, and FIG. 2B illustrates the same audio signal after application of wideband gain by a compression component. As shown in FIG. 2A, audio signal 202 represents a transient (transient event) or sound impulse such as may be produced by a percussive instrument (e.g., castanets). The signal features a spike in amplitude as shown in the plot of voltage, V, versus time, t. In general, the amplitude of the signal is related to the acoustic energy or intensity of the sound and represents a measure of the sound's power at any point in time. When the audio signal 202 is processed through a frame-based audio codec, portions of the signal are processed within transform (e.g., MDCT) frames 204. Typical present digital audio systems utilize frames of relatively long duration, so that for sharp transient or short impulse sounds, a single frame may include sounds of low intensity as well high intensity. Thus, as shown in FIG. 2 the single MDCT frame 204 includes the impulse portion (peak) of the audio signal as well as a relatively large amount of low intensity signal before and after the peak. In an embodiment, a compression component 104 divides the signal into a number of short time segments, 206, and applies a wideband gain to each segment in order to compress the dynamic range of the signal 202. The number and size of each short segment may be selected based on application needs and system constraints. Relative to the size of an individual MDCT frame, the number of short segments may range from 12 to 64 segments, and may typically comprise 32 segments, but embodiments are not so limited.

FIG. 2B illustrates the audio signal of FIG. 2A after the application of wideband gain over each of the short time segments, under an embodiment. As shown in FIG. 2B, audio signal 212 has the same relative shape as the original signal 202, however, the amplitude of the low intensity segments has been increased by application of amplifying gain values, and the amplitude of the high intensity segments has been decreased by application of attenuating gain values.

The output of the core decoder 112 is the input audio signal with reduced dynamic range (e.g., signal 212) plus quantization noise introduced by the core encoder 106. This quantization noise features an almost uniform level across time within each frame. The expansion component 114 acts on the decoded signal to restore the dynamic range of the original signal. It uses the same short time resolution based on the short segment size 206 and inverts the gains applied in the compression component 104. Thus, the expansion component 114 applies a small gain (attenuation) on segments that in the original signal had low intensity, and had been amplified by the compressor, and applies a large gain (amplification) on segments that in the original signal had high intensity and had been attenuated by the compressor. The quantization noise added by the core coder, that had a uniform time envelope, is thus concurrently shaped by the post-processor gain to approximately follow the temporal envelope of the original signal. This processing effectively renders the quantization noise less audible during quiet passages. Although the noise may be amplified during passages of high intensity, it remains less audible due to the masking effect of the loud signal of the audio content itself.

As shown in FIG. 2A, the companding process modifies discrete segments of the audio signal individually with respective gain values. In certain cases, this can result in discontinuities at the output of the compression component that can cause problems in the core encoder 106. Likewise, discontinuities in gain at the expansion component 114 could result in discontinuities in the envelope of the shaped noise, which could result in audible clicks in the audio output 116. Another issue related to application of individual gain values to short segments of the audio signal is based on the fact that typical audio signals are a mixture of many individual sources. Some of these sources may be stationary across time, and some may be transients. A stationary signal is generally constant in their statistical parameters over time, whereas transient signals are generally not constant. Given the broadband nature of transients, their fingerprint in such a mixture is usually more visible at the higher frequencies. A gain calculation that is based on the short-term energy (RMS) of the signal tends to be biased towards the stronger low frequencies and hence is dominated by the stationary sources, and exhibits little variation across time. Thus, this energy-based approach is generally ineffective in shaping the noise introduced by the core encoder.

In an embodiment, system 100 calculates and applies the gain at the compression and expansion components in a filter-bank with a short prototype filter in order to resolve the potential issues associated with the application of individual gain values. The signal to be modified (the original signal at the compression component 104, and the output of the core decoder 112 in the expansion component 114) is first analyzed by the filter-bank and the wideband gain is applied directly in the frequency domain. The corresponding effect in the time domain is to naturally smooth the gain application according to the shape of the prototype filter. This resolves the issues of discontinuities described above. The modified frequency domain signal is then converted back to the time domain via a corresponding synthesis filter-bank. Analyzing the signal with a filterbank provides access to its spectral content, and allows the calculation of gains that preferentially boost the contribution due to the high frequencies (or to boost the contribution due to any spectral content that is weak), providing gain values that are not dominated by the strongest components in the signal. This resolves the problem associated with audio sources that comprise a mixture of different sources, as described above. In an embodiment, the system calculates the gain using a p-norm of the spectral magnitudes where p is typically less than 2 ($p<2$). This enables more emphasis to the weak spectral content, as compared to when it is based on energy ($p=2$).

As stated above, the system includes a prototype filter to smooth the gain application. In general, a prototype filter is the basic window shape in a filterbank, which is modulated by sinusoidal waveforms to get the impulse responses for the different subband filters in the filterbanks. For instance, a short-time Fourier transform (STFT) is a filterbank, and each frequency line of this transform is a subband of the filterbank. The short-time Fourier transform is implemented by multiplying a signal with a window shape (an N-sample window), which could be rectangular, Hann, Kaiser-Bessel derived (KBD), or some other shape. The windowed signal is then subject to a discrete Fourier transform (DFT) operation, to obtain the STFT. The window shape in this case is the prototype filter. The DFT is composed of sinusoidal basis functions, each of a different frequency. The window shape multiplied by a sinusoidal function then provides the filter for the subband corresponding to that frequency. Since the window shape is the same at all frequencies, it is referred to as a "prototype".

In an embodiment, the system utilizes a QMF (Quadrature Modulated Filter) bank for the filterbank. In a particular implementation, the QMF bank may have a 64-pt window, which forms the prototype. This window modulated by cosine and sine functions (corresponding to 64 equally spaced frequencies) forms the subband filters for the QMF bank. After each application of the QMF function, the window is moved over by 64 samples, i.e., the overlap between time segments in this case is 640−64=576 samples. However although the window shape spans ten time segments in this case (640=10*64), the main lobe of the window (where its sample values are very significant) is about 128 samples long. Thus, the effective length of the window is still relatively short.

In an embodiment, the expansion component 114 ideally inverts the gains applied by the compression component 104. Although it is possible to transmit the gains applied by the compression component through the bitstream to the decoder, such an approach would typically consume a significant bit-rate. In an embodiment, system 100 instead estimates the gains required by the expansion component 114 directly from the signal available to it, i.e., the output of the decoder 112, which effectively requires no additional bits. The filterbank at the compression and expansion components are selected to be identical in order to calculate gains that are inverses of each other. In addition, these filterbanks are time synchronized so that any effective delays between the output of the compression component 104 and the input to the expansion component 114 are multiple of the stride of the filterbank. If the core encoder-decoder were lossless, and the filterbank provides perfect reconstruction, the gains at the compression and expansion components would be exact inverses of each other, thus allowing for exact reconstruction of the original signal. In practice, however, the gain applied by the expansion component 114 is only a close approximation of the inverse of the gain applied by the compression component 104.

In an embodiment, the filterbank used in the compression and expansion components is a QMF bank. In a typical use application, a core audio frame could be 4096 samples long with an overlap of 2048 with the neighboring frame. At 48 kHz such a frame would be 85.3 milliseconds long. In contrast, a QMF bank that is used may have a stride of 64 samples (which is 1.3 milliseconds long), which provides a fine temporal resolution for the gains. Further, the QMF has a smooth prototype filter that is 640 samples long ensuring that the gain application varies smoothly across time. Analysis with this QMF filterbank provides a time-frequency tiled representation of the signal. Each QMF time-slot is equal to a stride and in each QMF time-slot there are 64 uniformly spaced subbands. Alternatively, other filterbanks could be employed, such as a short term Fourier transform (STFT), and such a time-frequency tiled representation could still be obtained.

Figure 6:
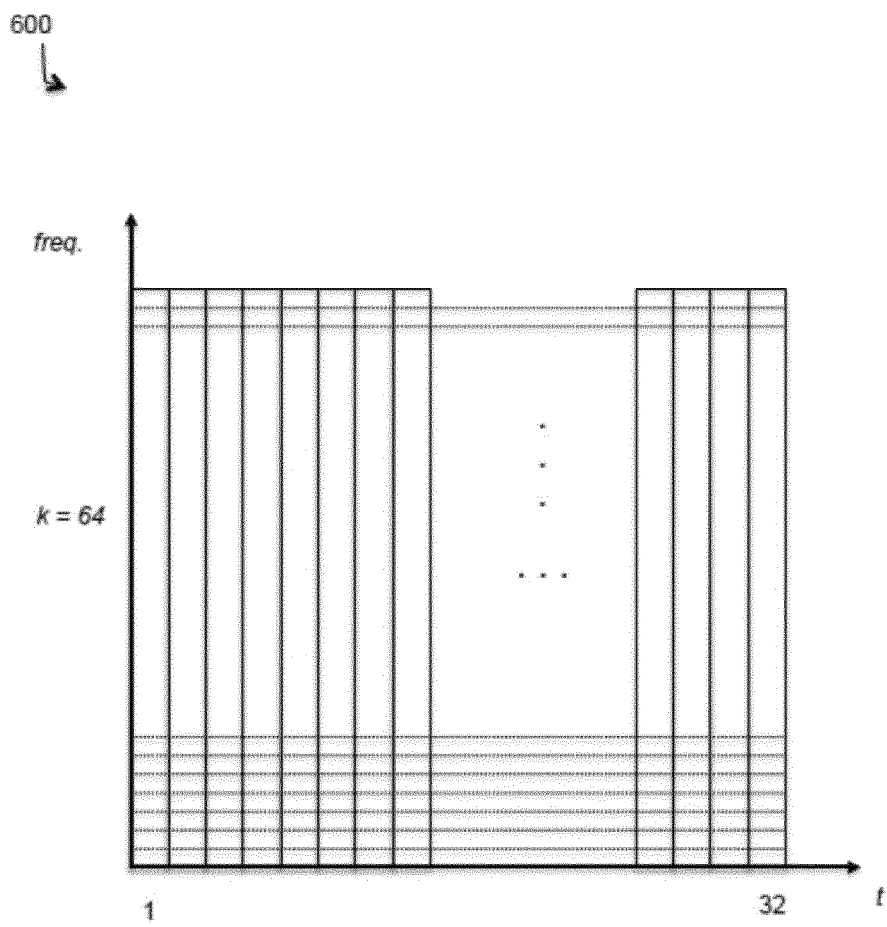
FIG. 6 illustrates the division of an audio signal into a plurality of short time segments, under an embodiment.

In an embodiment, the compression component 104 performs a pre-processing step that scales the codec input. For this embodiment, $S_t(k)$ is a complex valued filterbank sample at time slot t and frequency bin k. FIG. 6 illustrates the division of an audio signal into a number of time slots for a range of frequencies, under an embodiment. For the embodiment of diagram 600, there are 64 frequency bins k, and 32 time slots t that produce a plurality of time-frequency tiles as shown (though not necessarily drawn to scale). The compression pre-steps scales the codec input to become $S'_t(k)=S_t(k)/g_t$. In this equation, $g_t=(\bar{S}_t/S_0)^\gamma$ is a normalized slot mean.

In the above equation, the expression, $$\bar{S}_t = \frac{1}{K}\Sigma_{k=1}^{K}\left|S_t(k)\right|$$

is the mean absolute level/1-norm and $S_0$ is a suitable constant. A generic p-norm is defined in this context as follows:

$$\bar{S}_t = \left(\frac{1}{K}\sum_{k=1}^{K}\left|S_t(k)\right|^p\right)^{1/p}$$

It has been shown that the 1-norm may give significantly better results than using the energy (RMS/2-norm). The value of the exponent term γ is typically in the range of between 0 and 1, and may be chosen to be ⅓. The constant $S_0$ ensures reasonable gain values independent of the implementation platform. For instance, it may be 1 when implemented in a platform where all the $S_t(k)$ values might be limited in absolute value to 1. It could potentially be different in a platform where $S_t(k)$ may have a different maximum absolute value. It could also be used to make sure that mean gain value across a large set of signals is close to 1. That is, it could be an intermediate signal value between a maximum signal value and a minimum signal value determined from large corpora of content.

In the post-step process performed by the expansion component 114, the codec output is expanded by an inverse gain applied by the compression component 104. This requires an exact or near-exact replica of the filterbank of the compression component. In this case, $\tilde{S}_t(k)$ represents a complex valued sample of this second filterbank. The expansion component 114 scales the codec output to become $\tilde{S}'_t(k)=\tilde{S}_t(k)\cdot\tilde{g}_t$.

In the above equation $\tilde{g}_t$ is a normalized slot mean given as:

$$\tilde{g}_t = \left(\bar{\tilde{S}}_t/S_0\right)^{\gamma/(1-\gamma)}$$

and $$\bar{\tilde{S}}_t = \left(\frac{1}{K}\sum_{k=1}^{K}\left|\tilde{S}_t(k)\right|^p\right)^{1/p}$$

In general, the expansion component 114 will use the same p-norm as used in the compression component 104. Thus if the mean absolute level is used to define $\bar{S}_t$ in the compression component 104, $\overline{S}_f$ is also defined using the 1-norm (p=1) in the above equation.

When a complex filterbank (comprising of both cosine and sine basis functions), such as the STFT or the complex-QMF is used in the compression and expansion components, the calculation of the magnitude, $|\tilde{S}_r(k)|$ or $|S_r(k)|$ of a complex subband sample requires a computationally intensive square-root operation. This can be circumvented by approximating the magnitude of the complex subband sample in a variety of ways, for instance, by summing up the magnitude of its real and imaginary parts.

In the above equations, the value K is equal to the number of subbands in the filterbank, or lower. In general, the p-norm could be calculated using any subset of the subbands in the filterbank. However, the same subset should be employed at both the encoder 106 and decoder 112. In an embodiment, the high frequency portions (e.g., audio components above 6 kHz) of the audio signal could be coded with an advanced spectral extension (A-SPX) tool. Additionally it may be desirable to use only the signal above 1 kHz (or a similar frequency) to guide the noise-shaping. In such a case only those subbands in the range 1 kHz to 6 kHz may be used to calculate p-norm, and hence the gain value. Furthermore, although the gain is calculated from one subset of subbands it could still be applied to a different, and possibly larger, subset of subbands.

Figure 3A:
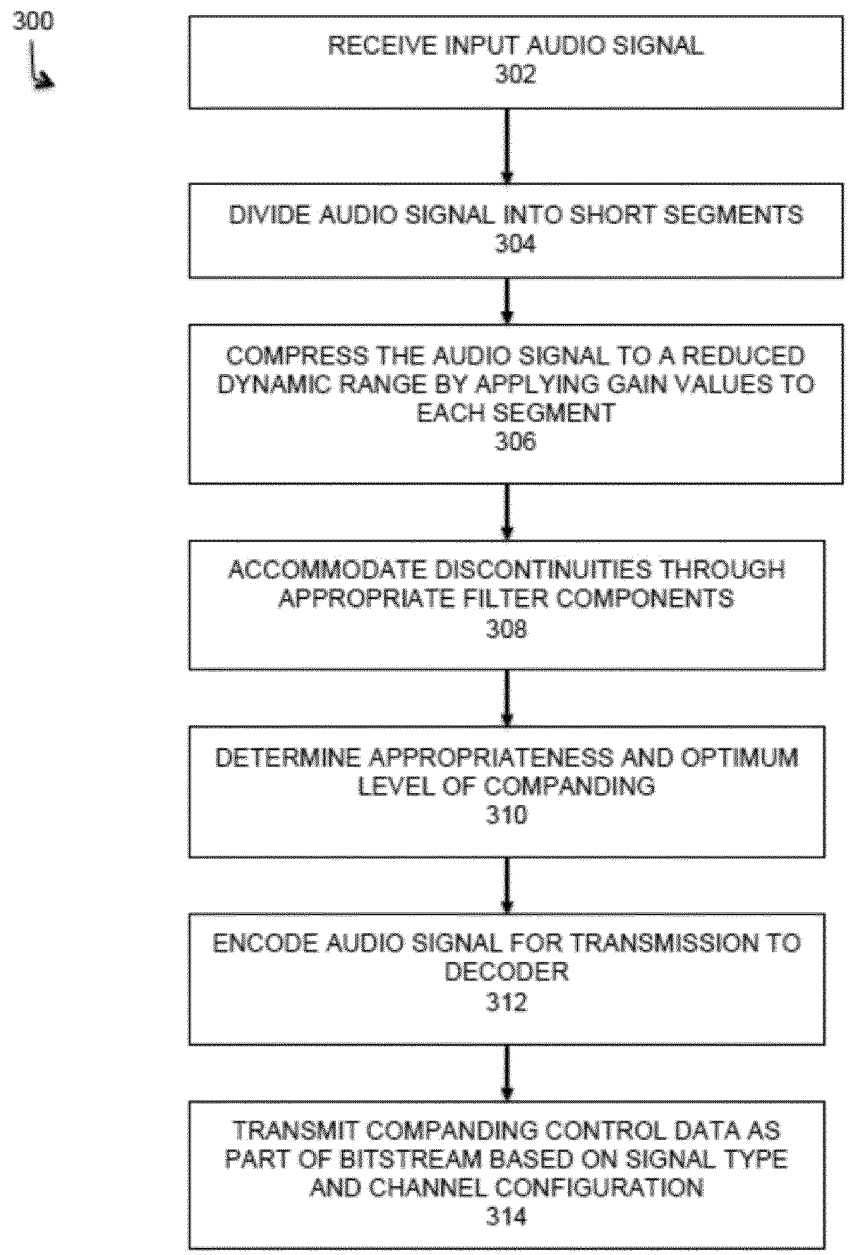
FIG. 3A is a flowchart illustrating a method of compressing an audio signal, under an embodiment.

As shown in FIG. 1, the companding function to shape quantization noise introduced by the core encoder 106 of an audio codec is performed two separate components 104 and 114 performing certain pre-encoder compression functions and post-decoder expansion functions. FIG. 3A is a flowchart illustrating a method of compressing an audio signal in a pre-encoder compression component, under an embodiment, and FIG. 3B is a flowchart illustrating a method of expanding an audio signal in a post-decoder expansion component, under an embodiment.

As shown in FIG. 3A, process 300 begins with the compression component receiving the input audio signal (302). This component then divides the audio signal into short time-segments (304) and compresses the audio signal to a reduced dynamic range by applying wideband gain values to each of the short segments (306). The compression component also implements certain prototype filtering and QMF filterbank components to reduce or eliminate any discontinuities caused by applying different gain values to contiguous segments, as described above (308). In certain cases, such as based on the type of audio content or certain characteristics of the audio content, compression and expansion of the audio signal before and after the encode/decode stages of the audio codec may degrade rather than enhance the output audio quality. In such instances, the companding process may be turned off, or modified to return different companding (compression/expansion) levels. Thus, the compression component determines the appropriateness of the companding function and/or the optimum level of companding required for the specific signal input and audio playback environment, among other variables (310). This determination step 310 may occur at any practical point of process 300, such as prior to the division of the audio signal 304 or the compression of the audio signal 306. If companding is deemed to be appropriate, the gains are applied (306), and the encoder then encodes the signal for transmission to the decoder in accordance with the data format of the codec (312). Certain companding control data, such as activation data, synchronization data, companding level data, and other similar control data may be transmitted as part of the bitstream for processing by the expansion component.

Figure 3B:
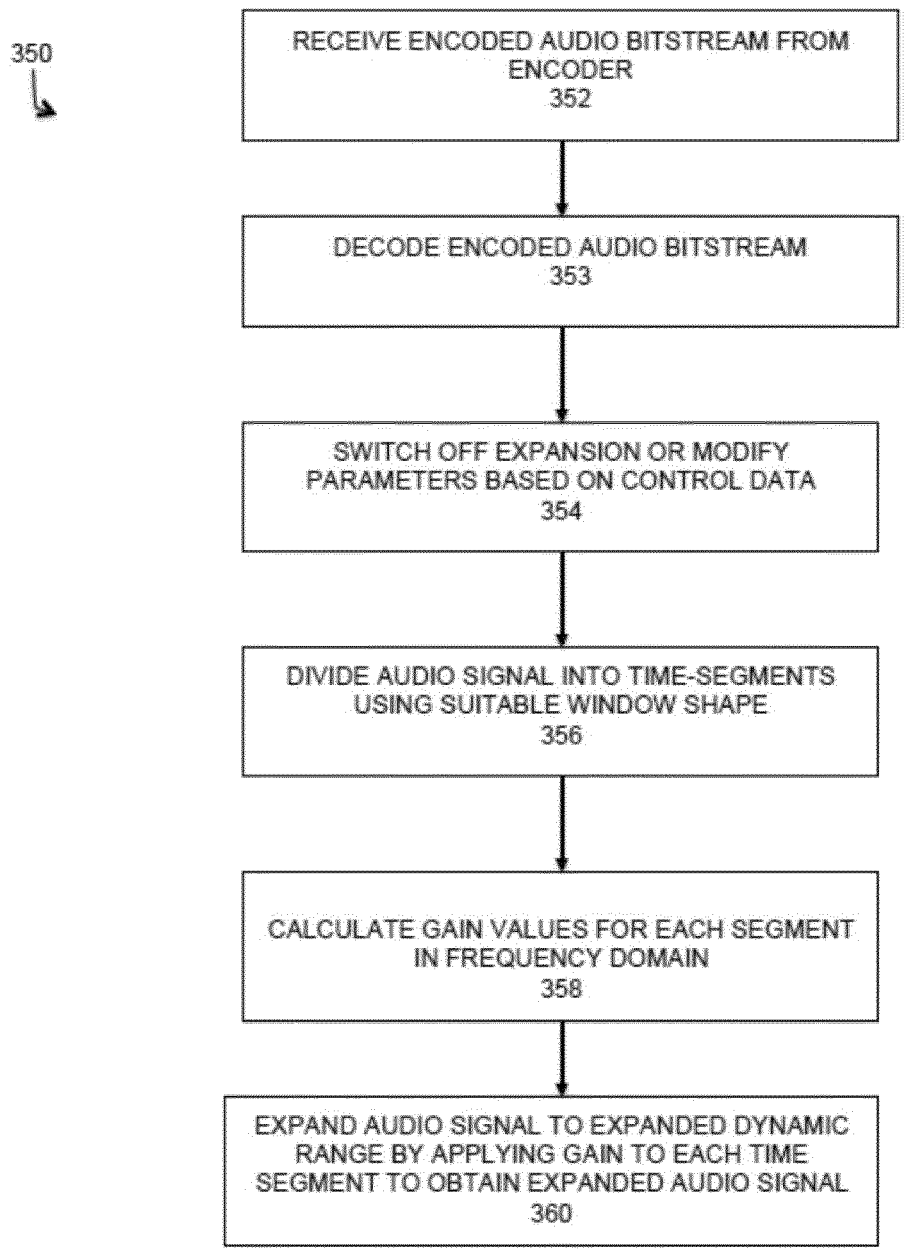
FIG. 3B is a flowchart illustrating a method of expanding an audio signal, under an embodiment.

FIG. 3B is a flowchart illustrating a method of expanding an audio signal in a post-decoder expansion component, under an embodiment. As shown in process 350, the decoder stage of the codec receives the bitstream encoding the audio signal from the encoder stage (352). The decoder then decodes the encoded signal in accordance with the codec data format (353). The expansion component then processes the bitstream and applies any encoded control data to switch off expansion or modify the expansion parameters based on the control data (354). The expansion component divides the audio signal into time segments using a suitable window shape (356). In an embodiment, the time segments correspond to the same time segments used by the compression component. The expansion component then calculates the appropriate gain values for each segment in the frequency domain (358) and applies the gain values to each time segment to expand the dynamic range of the audio signal back to the original dynamic range, or any other appropriate dynamic range (360).

Companding Control

The compression and expansion components comprising the compander of system 100 may be configured to apply the pre and post-processing steps only at certain time during audio signal processing, or only for certain types of audio content. For example, companding may exhibit benefits for speech (which consists of pseudo-stationary series of impulse-like events) and musical transient signals. However, for other signals, such as stationary signals companding may degrade the signal quality. Thus, as shown in FIG. 3A, a companding control mechanism is provided as block 310, and control data is transmitted from the compression component 104 to the expansion component 114 to coordinate the companding operation. The simplest form of such a control mechanism is to switch off the companding function for the blocks of audio samples where application of the companding is degrading the audio quality. In an embodiment, the companding on/off decision is detected in the encoder and transmitted as bitstream element to the decoder so that compressor and expander are able to be switched on/off at the same QMF time slot.

The switching between the two states will usually lead to a discontinuity in the applied gain, resulting in audible switching artifacts or clicks. Embodiments include mechanisms to reduce or eliminate these artifacts. In a first embodiment, the system allows switching of the companding function off and on only at frames where the gain is close to 1. In this case, there is only a small discontinuity between switching the companding function on/off. In a second embodiment, a third weak companding mode, that is in between on and off mode is applied in an audio frame between on and off frames, and is signaled in the bitstream. The weak companding mode slowly transitions the exponent term γ from its default value during companding to 0, which is the equivalent of no companding. As an alternative to the intermediate weak companding mode, the system may implement start-frames and stop-frames that over a block of audio samples smoothly fade into an out-of-companding mode instead of abruptly switching off the companding function. In a further embodiment, the system is configured not to simply switch off the companding but rather apply an average gain. In certain cases, the audio quality of tonal-stationary signals can be increased if a constant gain factor is applied to an audio frame that more greatly resembles the gain factors of adjacent companding-on frames than a constant gain factor of 1.0 in a companding off situation. Such a constant average companding gain factor can be calculated by averaging all the mean absolute level/1-norm computed per time slot over one frame. A frame containing constant average companding gain is thus signaled in the bitstream.

Although embodiments are described in the context of a monophonic audio channel, it should be noted that in a straightforward extension multiple channels could be handled by repeating the approach individually on each channel. However, audio signals that comprise two or more channels present certain additional complexities that are addressed by embodiments of the companding system of FIG. 1. The companding strategy should depend on the similarity between channels.

For example, in the case of stereo-panned transient signals it has been observed that independent companding of the individual channels may result in audible stereo image artifacts. In an embodiment, the system determines a single gain value for each time-segment from the subband samples of both channels and uses the same gain value to compress/expand the two signals. This approach is generally suitable whenever the two channels have very similar signals, wherein similarity is defined using cross correlation, for instance. A detector calculates the similarity between channels and switches between using individual companding of the channels or jointly companding the channels. Extensions to more channels would divide the channels into groups of channels using similarity criteria and apply joint companding on the groups. This grouping information can then be transmitted through the bitstream.

System Implementation

Figure 4:
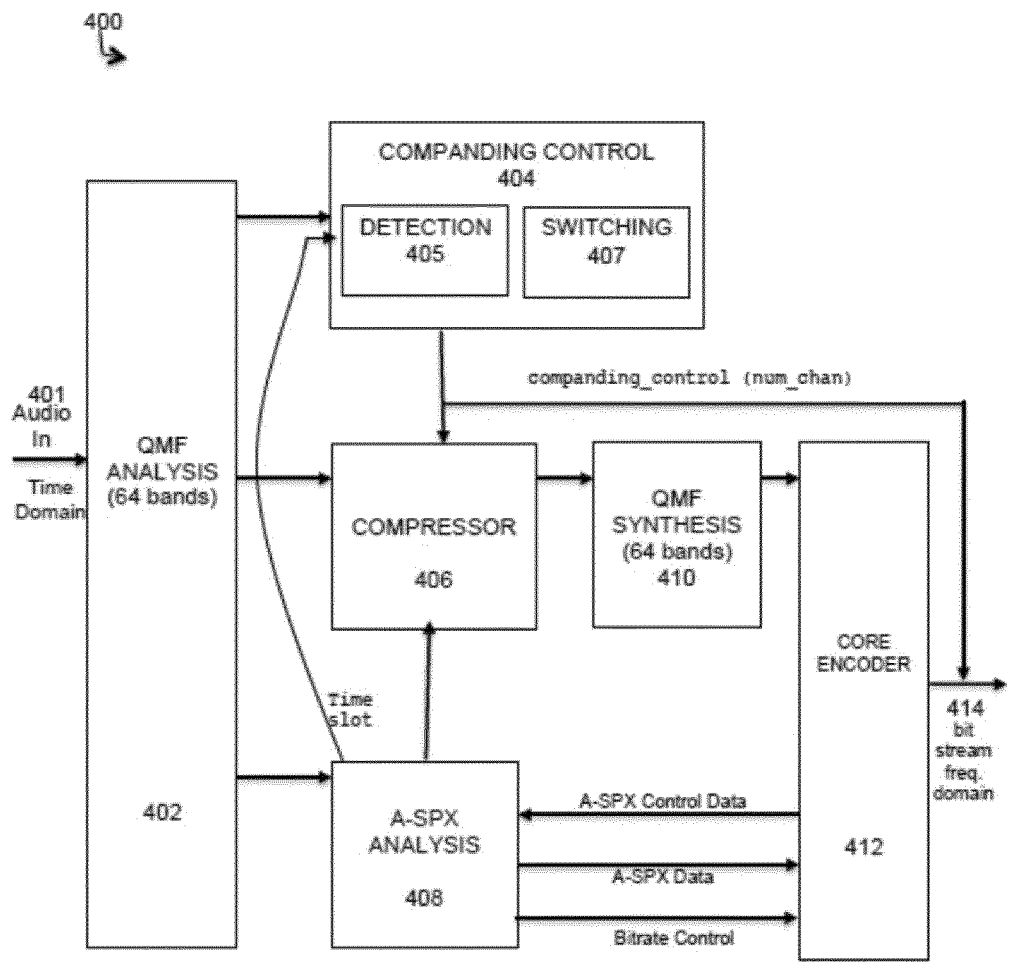
FIG. 4 is a block diagram illustrating a system for compressing an audio signal, under an embodiment.

FIG. 4 is a block diagram illustrating a system for compressing an audio signal in conjunction with an encoder stage of a codec, under an embodiment. FIG. 4 illustrates a hardware circuit or system that implements at least a portion of the compression method for use in a codec-based system shown in FIG. 3A. As shown in system 400, an input audio signal 401 in the time domain is input to a QMF filterbank 402. This filterbank performs an analysis operation that separates the input signal into multiple components in which each bandpass filter carries a frequency sub-band of the original signal. Reconstruction of the signal is performed in a synthesis operation performed by QMF filterbank 410. In the example embodiment of FIG. 4, both the analysis and synthesis filterbanks handle 64 bands. The core encoder 412 receives the audio signal from the synthesis filterbank 410 and generates a bitstream 414 in the frequency domain by encoding the audio signal in the appropriate digital format (e.g., MP3, AAC, AC-4, etc.).

System 400 includes a compressor 406 that applies gain values to each of the short segments that the audio signal has been divided into. This produces a compressed dynamic range audio signal, such as shown in FIG. 2B. A companding control unit 404 analyzes the audio signal to determine whether or how much compression should be applied based on the type of signal (e.g., speech), or the characteristics of the signal (e.g. stationary versus transient), or other relevant parameters. The control unit 404 may include a detection mechanism to detect the temporal peakness characteristic of the audio signal. Based on the detected characteristic of the audio signal and certain pre-defined criteria, the control unit 404 sends appropriate control signals to the compressor 406 to either turn off the compression function or modify the gain values applied to the short segments.

It should be noted that the term "peakness" may also be referred to as "sharpness" (e.g., $T_p$ or $T_s$) and both refer to the instantaneous energy of a signal at a specific time relative to immediate past and future times, such that a peaky or sharp signal appears as an impulse or spike in energy.

In addition to companding, many other coding tools could also operate in the QMF domain. One such tool is A-SPX, which is shown in block 408 of FIG. 4. A-SPX is a technique that is used to allow perceptually less important frequencies to be coded with a coarser coding scheme than more important frequencies. For example, in A-SPX at the decoder end, the QMF subband samples from the lower frequency may be replicated at the higher frequencies, and the spectral envelope in the high frequency band is then shaped using side information transmitted from the encoder to the decoder. A-SPX is used by certain advanced codes such as AC-4, for example, and other similar tools may also be used.

Figure 5:
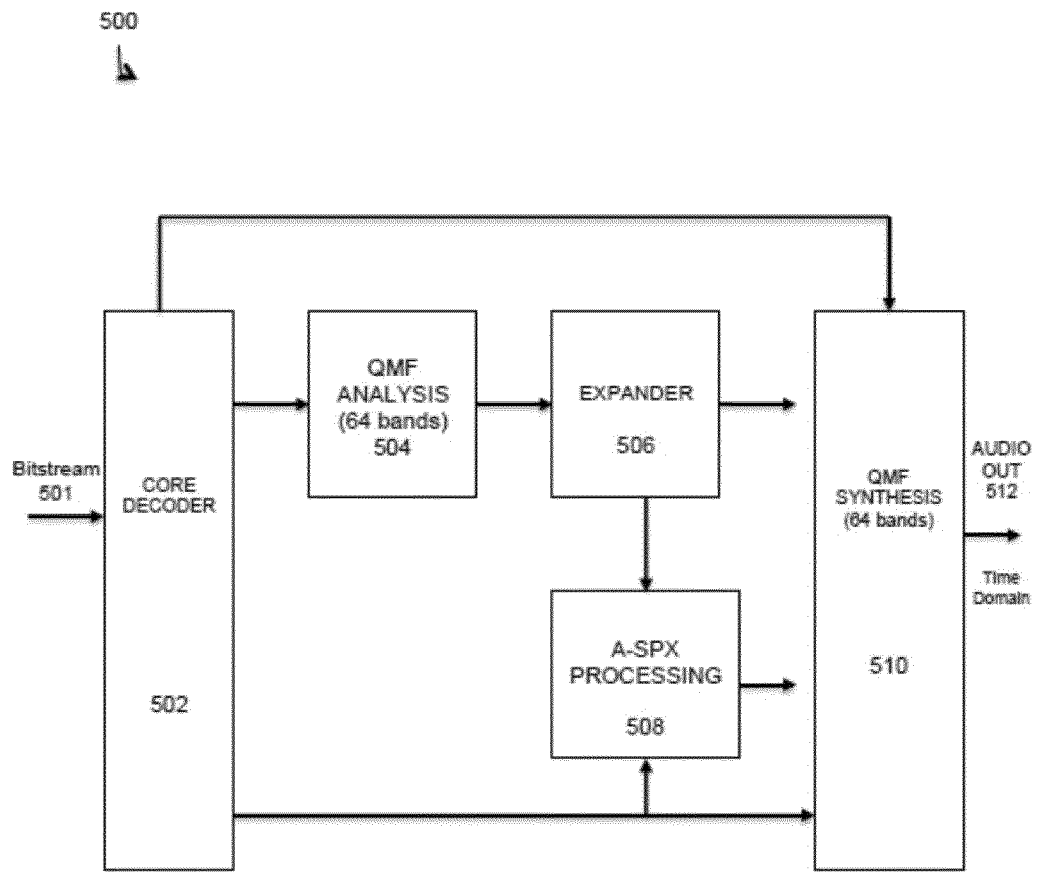
FIG. 5 is a block diagram illustrating a system for expanding an audio signal, under an embodiment.

In a system where both companding and A-SPX coding are performed in the QMF domain, at the encoder, the envelope data for the higher frequencies may be extracted from the yet uncompressed subband samples as shown in FIG. 4, and compression may be applied only to the lower frequency QMF samples that correspond to the frequency range of the signal encoded by the core encoder 412. At the decoder 502 of FIG. 5, after QMF analysis 504 of the decoded signal, the expansion process 506 is applied first, and the A-SPX operation 508 subsequently reproduces the higher subband samples from the expanded signal in the lower frequencies.

In this example implementation, the QMF synthesis filterbank 410 at the encoder and the QMF analysis filterbank at the decoder together introduce 640−64+1 sample delay (~9 QMF slots). The core codec delay in this example is 3200 samples (50 QMF slots), so the total delay is 59 slots. This delay is accounted for by embedding control data into the bitstream and using at the decoder, so that both the encoder compressor and the decoder expander operations are in synchrony.

Alternatively, at the encoder, compression may be applied on the entire bandwidth of the original signal. The envelope data may be subsequently extracted from the compressed subband samples. In such a case, the decoder, after QMF analysis, first runs a tool to first reconstruct the full bandwidth compressed signal. The expansion stage is then applied to recover the signal with its original dynamic range.

Yet another tool that could operate in the QMF domain may be a parametric stereo (PS) tool (not shown) in FIG. 4. In parametric stereo, two channels are encoded as a mono downmix with additional parametric spatial information that can be applied in the QMF domain at the decoder to reconstruct a stereo output. Another such tool is the Advanced Coupling (A-CPL) toolset that is used by certain advanced codes such as AC-4, for example. When parametric stereo (or A-CPL) and companding are used in conjunction with each other, the parametric stereo tool could either be placed after the compression stage 406 at the encoder, in which case it would be applied before the expansion stage 506 at the decoder. Alternatively, the parametric stereo side-information could be extracted from the uncompressed stereo signal in which case the parametric stereo tool would operate after the expansion stage 506 at the decoder.

As shown in FIGS. 3A and 3B, the bitstream transmitted between the encoder stage and the decoder stage of the codec includes certain control data. Such control data constitutes side-information that allows the system to switch between different companding modes. The switching control data (for switching companding on/off) plus potentially some intermediate states may add on the order of 1 or 2 bits per channel. Other control data can include a signal to determine if all the channels of a discrete stereo or multi-channel configuration will use common companding gain factors or if they should be are calculated independently for each channel. Such data may only require a single extra bit. Other similar control data elements and their appropriate bit weights may be used depending on system requirements and constraints.

Detection Mechanism

In an embodiment, a companding control mechanism is included as part of the compression component 104 to provide control of the companding in the QMF-domain. Companding control can be configured based on a number of factors, such as audio signal type. For example, in most applications, companding should be turned on for speech signals and transient signals or any other signals within the class of temporally peaky signals (such as applause). The system includes a detection mechanism 405 to detect the peakness of a signal in order to help generate an appropriate control signal for the compander function. The detection mechanism 405 may be said to analyze the signal to determine, for example, whether the signal is a sparse transient signal or a dense transient signal. In this sense, the temporal peakness of the signal can be used to derive a measure of a density of transients (transient events) in the signal.

In an embodiment, the normalized $4^{th}$ moment is used to measure the degree of fluctuations in an envelope signal. A measure for temporal peakness $TP(k)_{frame}$ is computed over frequency bin k for a given core codec, and is calculated using the following formula:

$$TP(k)_{frame} = \frac{\sqrt{\sqrt{\frac{1}{T}\Sigma_{t=0}^{T-1} S_t(k)^4}}}{\sqrt{\frac{1}{T}\Sigma_{t=0}^{T-1} S_t(k)^2}},$$

Similarly, a spectral peakness measure may be computed over a time slot t. In the above equation, $S_t(k)$ is the sub-band signal, and T is the number of QMF slots corresponding to one core encoder frame. In an example implementation, the value of T may be 32. The temporal peakness computed per band can be used to classify the sound content into general two categories: stationary music signals, and musical transient signals or speech signals. If the value of $TP(k)_{frame}$ is less than a defined value (e.g., 1.2), the signal in that subband of the frame is likely to be a stationary music signal. If the value of $TP(k)_{frame}$ is greater than this value, then the signal is likely to be musical transient signals or speech signals. If the value is greater than an even higher threshold value (e.g., 1.6), the signal is very likely to be a pure musical transient signal, e.g., castanets. Furthermore, it has been observed that for naturally occurring signals the values of temporal peakness obtained in different bands was more or less similar, and this characteristic could be employed to reduce the number of subbands for which temporal peakness value is to be calculated.

It should be noted that since peakness (sharpness) is the opposite of flatness, any flatness-based measure may be used in an analogues way. For complex-valued transforms as used in AC-4, magnitudes of complex values of $S_t(k)$ are used. The above temporal sharpness measure maybe also applied to real-valued transforms. In the above expression, for an AC-4/A-SPX embodiment, T is the total number of QMF time-slots in a frame whose final value (depending on stationary or transient content) is determined by the A-SPX framing generator. For a 2048 frame length, T is 2048/64=32 for stationary content. Since, AC-4 supports various frame lengths (to support video frame synchronous audio coding); the values of T are different for different frame lengths. As stated above, the calculation of the magnitude a complex subband sample requires a computationally intensive square-root operation, which can be circumvented by approximating the magnitude of the complex subband sample in a variety of ways, for instance, by summing up the magnitude of its real and imaginary parts.

With reference to FIG. 4, it should be noted that for the QMF-matrix, the number of time slots can change based on the A-SPX analysis and may vary from signal to signal, so the time boundary data must come from the A-SPX analysis component.

Companding Switch

In an embodiment, the system described above reduces the dynamic range of the input signal prior to the core encoder. In this sense, companding before core encoding may correspond to compression of the dynamic range of the input signal. The system does so by modifying QMF time slots (in core coding or equivalently in non-A-SPX frequency range) by a broadband gain value. The gain values are large (i.e., amplification) for slots of relatively low intensity and small (i.e., attenuation) for slots of high intensity.

In general, companding has been found to help with content such as applause or speech, or signals with sharp attack (e.g., percussive effects) and not help with other types of content, such as tonal audio. Thus, signal-adaptive companding applies companding depending on the signal that is detected. In an embodiment, the encoder/decoder system 100 of FIG. 1 performs signal-adaptive or signal-dependent companding to implement a companding mode switching process that provides an optimum amount of companding based on the signal content. As stated above, companding provides temporal noise shaping, and has been observed to provide perceptually beneficial frequency-domain noise shaping (where perceptually beneficial means that the quantization noise is better shaped to (follow and) stay below the masking curve). However, since companding is a non-linear operation, it is generally difficult to predict its frequency-domain benefit in conjunction with the psychoacoustic model (also a non-linear model). Applying companding incorrectly, such as through a sub-optimal switching strategy may cause switching artifacts and increase system complexity and delay. The companding switching process under certain embodiments determines when companding helps, and how best to apply signal-adaptive companding.

FIG. 4 shows a system for compressing an audio signal in conjunction with an encoder stage of a codec and that includes a compander switching component or function 407. The switch 407 is configured to facilitate optimized companding selection by not simply switching companding OFF abruptly, but instead applying a constant gain factor to an audio frame that resembles more the gain factors of adjacent companding ON frames rather than a constant gain factor of 1.0 in a companding OFF situation. Such a gain factor is calculated by averaging mean absolute levels over slots in one frame. A frame where average companding is employed is signaled in the bit-stream (e.g., b_compand_avg). Average in this context means average of mean absolute levels.

In an embodiment, the switch 407 is configured to switch between one of three companding states: No Companding (Compand_Off); Normal Companding (Compand_On), and Average Companding (Compand_Ave). In certain embodiments, the compand_off mode is used only for pure sinusoidal signals, and for all other signals, the system switches between on and average mode.

For normal companding: if $S_t(k)$ is a complex-valued filter-bank sample at time slot t and frequency band k, the pre-processing step scales the core codec input to become $SC_t(k)=S_t(k)g_t$, where $g_t=(SM_t)^{\alpha-1}$ and is the normalized slot mean (or gain); with $SM_t$ being the mean absolute level (1-norm), given by $SM_t(k)=1/K\Sigma|S_t(k)|$ summed over the range of k=1 to K; and α=0.65. Here, α may be referred to as a companding exponent. In an embodiment, the companding detector is designed for complex values $S_t(k)$ whose magnitude lies between ±64. If the range of the complex values are different, the design needs to be scaled accordingly, thus other embodiments may feature different values, as appropriate.

Figure 7:
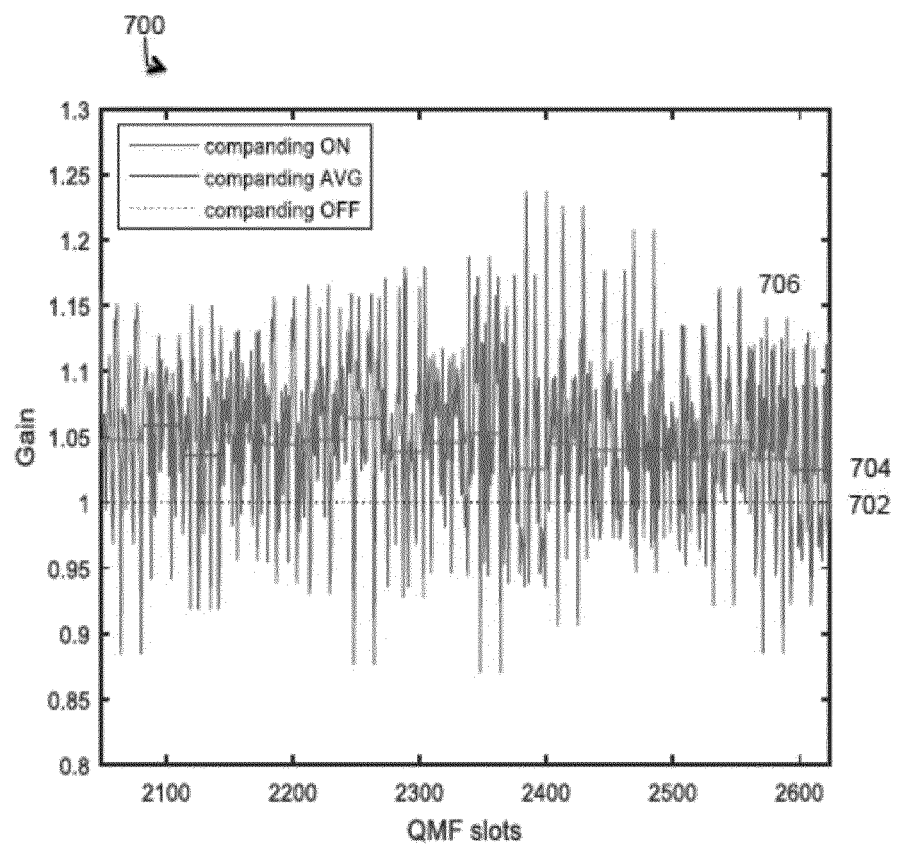
FIG. 7 illustrates example QMF slots for frames of a chord, in an example embodiment.

For average companding, FIG. 7 illustrates example QMF slots for frames of a chord, in an example embodiment. The plot 700 of FIG. 7 shows the tonal/harmonic content for an example multi-note chord as played on an appropriate instrument (e.g., piano or guitar). As shown in FIG. 7, the resulting gains for three different companding settings are shown. The companding_off trace 702 shows a flat gain, while the companding-on trace 706 shows relatively abrupt discontinuities in the gain. Such discontinuities at the post-processor (i.e., companding decoder) result in discontinuities in the envelope of the shaped noise, which causes audible clicks that can be perceived as annoying crackling noise. The companding_average trace 704 shows that employing average companding instead of normal companding (as described immediately above) eliminates audible clicks. Similar observations show that this also holds true for other tonal/harmonic content (e.g., harpsichord or similar instruments). In other words, companding hurts for tonal/harmonic content, and for tonal/harmonic content, companding should be either switched "off" or average companding should be employed.

If companding is applied in the encoder, output of the core decoder is this signal with reduced dynamic range with the addition of quantization noise of almost uniform level (time envelope) across time within each frame. A small gain (attenuation) is applied on slots that in the original signal had low intensity, and had been amplified by the pre-processor, and a large gain (amplification) is applied on slots that in the original signal had high intensity and had been attenuated by the pre-processor. The quantization noise is thus concurrently shaped by the post-processor gain to approximately follow the temporal envelope of the original signal. In the case that average companding is applied in the encoder, average companding needs to also be applied in the decoder, i.e., a constant gain factor is applied to an audio frame.

In an embodiment, temporal peakness (or sharpness) computed per band can be used to roughly classify audio content into the following categories, as defined by two threshold values:

(1) pure sinusoids, stationary music: $(TP(k)_{frame}<1.2)$
(2) stationary/tonal/transient music+speech+applause: $(1.2 \leq TP(k)_{frame} \leq 1.6)$
(3) pure transients (e.g., percussive attack): $(TP(k)_{frame}>1.6)$ The threshold values of 1.2 and 1.6 to distinguish the three categories of pure sinusoid/tonal/pure transient audio are derived from experimental data and may be different depending on the overall range and units of measurement. The specific values of 1.2 and 1.6 are derived for a companding detector designed for complex values $S_t(k)$ whose magnitude lies between ±64. If the ranges of the complex values are different, different threshold values would be used.

Figure 8:
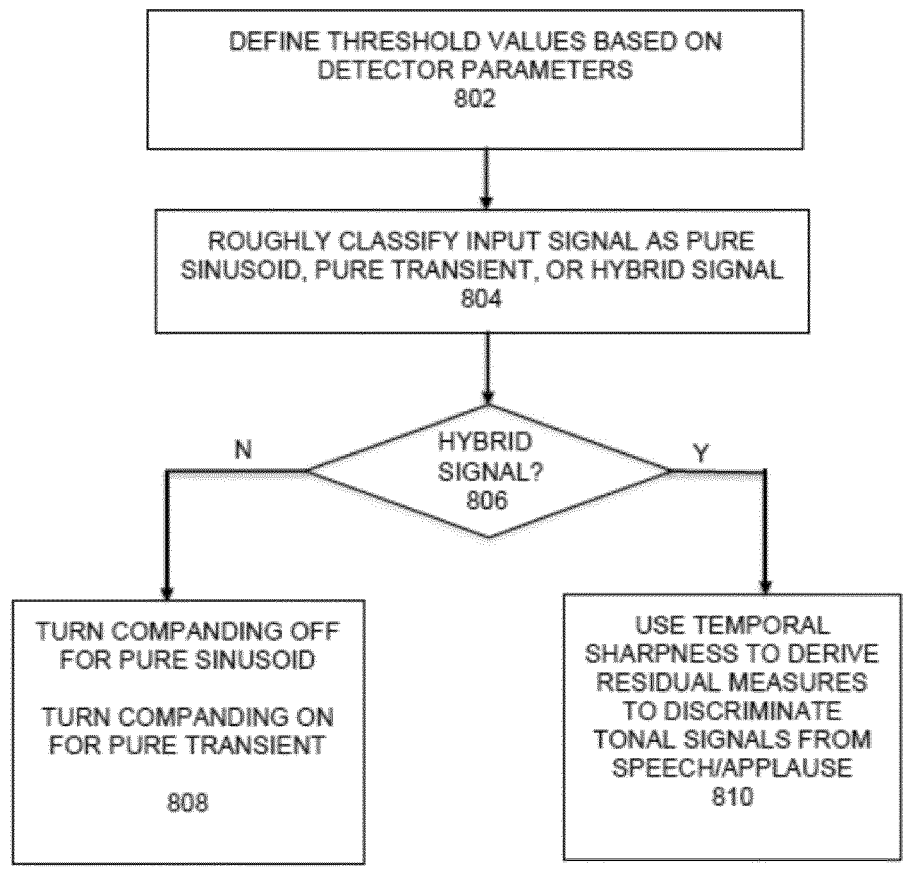
FIG. 8 is a flowchart that illustrates a method of classifying audio content using a signal-adaptive compander, under some embodiments.

FIG. 8 is a flowchart that illustrates a method of classifying audio content using a signal-adaptive compander, under some embodiments. The method starts in step 802 with defining the threshold values that distinguish the three main categories of content: (1) pure sinusoids, (2) stationary/tonal, and (3) pure transients. The second category, stationary/tonal may be any signal that comprises a mix of sinusoidal, transient, tonal, partially tonal signals, and so on, and generally comprises the vast majority of signals present in an audio program. Such content thus represents a mix of transient and sinusoidal signals, and is referred to as a "hybrid" signal. For classification into three main categories, two threshold values are defined. The threshold values are defined with respect to certain companding detector parameters, such as the magnitude of the complex values, as described above, such as 1.2 and 1.6, though any other values are also possible. Based on these threshold values, the input audio is roughly classified into the three categories, step 804, and a determination is made as to whether or not the signal is hybrid or not in decision block 806. If the signal is not hybrid it is either pure sinusoidal or pure transient in which case an appropriate companding rule can be applied, such as turning companding off for a pure sinusoid signal and turning companding on for a pure transient signal, block 808. If the signal is hybrid it comprises both sinusoid and transient signals and an on or off companding setting may not be optimum. In this case, further processing is required to distinguish tonal signals from transient or partially transient signals, such as due to speech or applause, or similar effects such as percussion or similar instruments. In an embodiment, temporal sharpness characteristics are used to derive residual measures that help discriminate tonal signals from such speech/applause signals, block 810. Details of this processing step are provided with reference to FIG. 9 below.

Thus, in an embodiment, the detection component 405 is configured to detect the type of signal based on the value of the input signal compared to the defined threshold values. This allows the system to discriminate stationary/tonal music from speech, which may also have tonal sections. The detector also uses spectral sharpness measures for better discrimination. It derives residual measures from the temporal sharpness measure using the fact that anything clearly not temporally sharp is spectrally sharp. Thus, after the rough classification of the signal as pure tonal or pure transient (categories 1 or 3 above) as opposed to stationary or transient (category 2 above), spectral sharpness is used to further distinguish the signal. Spectral sharpness is not computed directly, but is derived as residual measures from other calculations.

Figure 9:
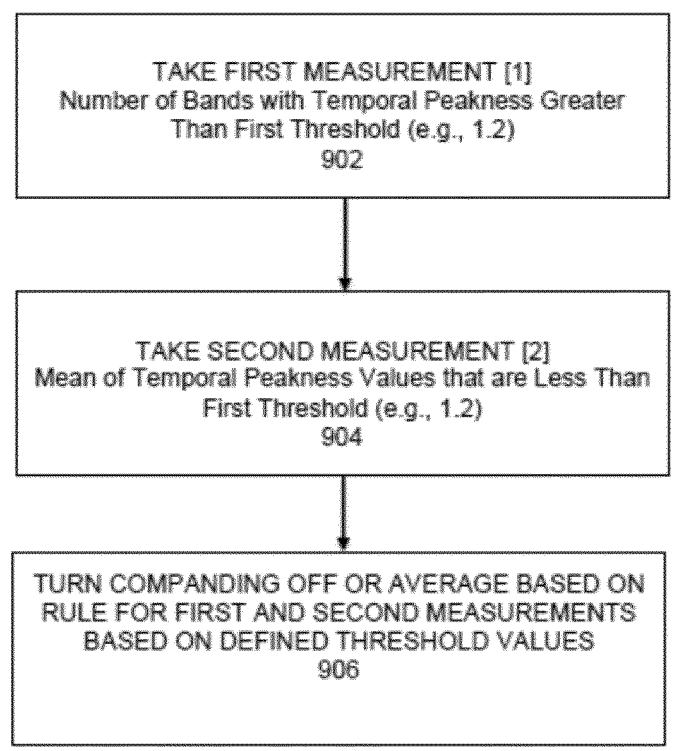
FIG. 9 is a flowchart illustrating a method of using spectral sharpness to distinguish speech or applause from tonal signals, under some embodiments.

With regard to the residual value derivation, FIG. 9 is a flowchart illustrating a method of using spectral sharpness to distinguish speech from tonal signals, under some embodiments. In step 902, the process takes Measure 1, which is the number of bands with temporal sharpness greater than 1.2. In step 904, the process takes Measure 2, which is the mean of temporal sharpness values which are less than 1.2, which is a residual measurement. The process then applies a defined rule or rules to turn the companding to off or average, block 906. This allows the system to adaptively employ companding depending on the content and keeping account of the fact that generally, companding hurts for tonal/harmonic content, and should be either switched off or to average companding, as shown in FIG. 7.

The code segment below illustrates an example rule to turn companding on or to average, and [1] indicates Measure 1 and [2] indicates Measure 2:

```
if ([1] > 8)
{
    if ([2] > 1.18)
        *cmpndOnOffSwitch = 1;
    else if (([2] <= 1.18) && ([2] > 1.12))
        *cmpndOnOffSwitch = 1;
    else if (([2] <= 1.12) && ([2] > 1.1))
        *cmpndOnOffSwitch = 1;
    else if ([2] <= 1.1)
        *cmpndOnOffSwitch = 1;
}
Else
{
    if ([2] > 1.18)
        *cmpndOnOffSwitch = 0;
    else if (([2] <= 1.18) && ([2] > 1.12))
        *cmpndOnOffSwitch = 1;
    else if (([2] <= 1.12) && ([2] > 1.1))
        *cmpndOnOffSwitch = 0;
    else if ([2] <= 1.1)
        *cmpndOnOffSwitch = 0;
}
```

This rule generates a series of ones and zeros. A value of one indicates that the companding mode is set on, a value of zero indicates that the companding mode is off, however off may result in average mode being used. Thus, in the above code example, 0 means average mode, and thus the code segment enables switching between companding ON and AVERAGE.

In the above rule, Measure 2 tries to do another round of classification to differentiate tonal signals from speech. Thresholds are appropriately defined (e.g., based on an overall measurement scale) such that anything higher than 1.18 is a pure transient and anything below 1.1 is a pure tonal signal. But such pure transient or pure tonal signals are most likely already classified by the outermost if condition. Therefore, the inner if statement tries to further fine tune the classification. For the region between 1.1 and 1.18, it has been found that most of the tonal components of speech lies within the range 1.12 and 1.18 and tonal components of music lie within 1.1 and 1.12.

As can be seen for the rule above, in one embodiment, the "on" and "averaging" sequence generates a detector that is configured as 1111 0100 with respect to the on/off or on/average settings of the companding mode. An alternative detector may look like: 1011 1000. For the above example, eight possibilities to switch companding "on" or "averaging". In general, the bit assignments, such as 1111 0100 and 1011 1000 are found by critical listening and/or the use of certain listening tools. Alternative configurations represent trade-offs to switch OFF companding slightly more often for tonal signals at the expense of switching OFF companding slightly more for speech. These may represent "second best" alternatives because the speech quality is slightly degraded. The configuration may be changed or modified based on system requirements and subjective measures of optimal versus sub-optimal sound and the desired trade-off between speech/applause versus tonal sounds.

For extreme cases, such as pure sinusoids, companding is switched "off" as shown in block 808 of FIG. 8, and in the code segment shown below.

```
if (((1] == 0)
    || (([2] == 0.00)&& ([1]  ! =
end_companding_subband)))
    *cmpndOnOffSwitch = 0;
```

The code segments above illustrate an implementation of the switching method, under some embodiments. It should be understood that the code segment illustrates an example software implementation, and variations and additional or different code structures may also be used.

The relationship between temporal and spectral sharpness is based on the fact that observations has shown that besides affecting temporal noise shaping, companding also provides certain perceptually beneficial noise shaping effects in the frequency domain. With reference to FIG. 6, in the QMF domain, the output of QMF is a matrix where the y-axis is frequency, and the x-axis are time slots. Each time slot consists of number of samples, and each band consists of number of frequencies. This frequency-by-time matrix can be used to detect temporal sharpness per frequency band, where the x-axis gives temporal sharpness. Likewise, the y-axis gives frequency sharpness, and although this is not necessarily computed, the frequency sharpness can be derived from this matrix.

FIG. 4 illustrates a system based on the Dolby AC-4 audio delivery system and format, as standardized with the European Telecommunications Standards Institute (ETSI) as TS 103 190 and adopted by Digital Video Broadcasting (DVB) in TS 101 154. Embodiments are also described with respect to Advanced Spectral Extension (A-SPX) coding tools for efficient coding of high frequencies at low bit rates. It should be noted that embodiments are not so limited and any appropriate codec design and audio coding and delivery method may be used.

In an embodiment, at the encoder (for either A-SPX only case or A-SPX+A-CPL case) the compressor is the last step prior to QMF synthesis. For the A-SPX+A-CPL case, the hybrid analysis/synthesis at the encoder acts before the compressor. Depending on the output of the companding controller 404, the compressor 406 may perform normal companding mode or average companding mode, based on the switch 407 function.

Through various experiments testing companding modes with different audio excerpts and using a listening tool to assess the quality of the audio output in light of degradation due to the audio coding process, it was found that excerpts degraded with companding on, are improved when average companding is used; and excerpts improved with companding "on" degraded very slightly when average companding was used. These two points imply that a system could switch between companding on and average companding most of the time. This provides the advantage of switching with more continuity in the applied gain, and avoiding potential switching artifacts. It also results in a low complexity and no delay detector incorporating companding control.

Although embodiments described so far include the companding process for reducing quantization noise introduced by an encoder in a codec, it should be noted that aspects of such a companding process may also be applied in signal processing systems that do not include encoder and decoder (codec) stages. Furthermore, in the event that the companding process is used in conjunction with a codec, the codec may be transform-based or non transform-based.

Figure 10:
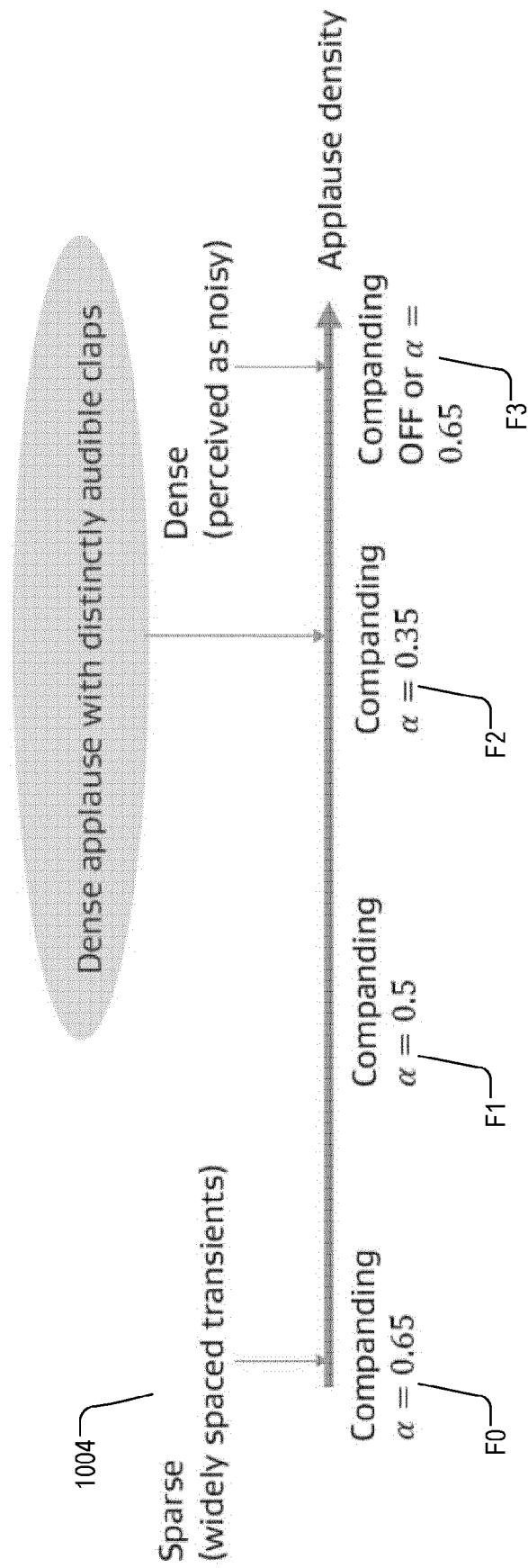
FIG. 10 illustrates example techniques of selecting a companding exponent based on content.

FIG. 10 illustrates example techniques of selecting a companding exponent (a) based on content (audio content). Notably, in the following reference will be made to frames of an audio signal that are to be understood as non-limiting examples of time segments of the audio signal. The disclosure is not to be understood as being limited to frames, but applies to all possible implementations of time segments alike.

A system including one or more computer processors receives (1004) one or more audio signals. The system determines that a first frame F0 of the signal includes a first transient type of signal, e.g., a sparse transient signal where transients are widely spaced. This may imply that the transients are individually perceivable and distinguishable, with (short) periods of silence between transients. Some examples of the first transient type of signals are castanet, techno music, speech, or some applause. In response, the system designates the companding exponent value to be a first value (e.g., $\alpha$=0.65) for the first frame F0.

The system can determine that a second frame F1 of the audio signal includes a second transient type of content. The second transient type of content includes a dense transient signal. An example of the second transient type of content is applauses with denser transients than the first type of content. In response, the system designates the companding exponent value to be a second value (e.g., $\alpha$=0.5) for the second frame.

The system determines that a third frame F2 of the audio signal includes a third transient type of content. The third transient type of content includes a transient signal that has denser transients than the second transient type of content. An example of the third transient type of content is dense applauses with high clap density. In response, the system designates the companding exponent value to be a third value (e.g., $\alpha$=0.35) for the third frame. In general, the first to third values may decrease in value from the first value to the third value, e.g., from $\alpha$=0.65, via $\alpha$=0.5, to $\alpha$=0.35.

The system determines that a fourth frame F3 of the audio signal includes a fourth transient type of content. The fourth transient type of content includes a transient signal that is so dense in transients as to be perceived to be noise. In response, the system designates the companding exponent value to be a fourth value for the fourth frame. The fourth value may be equal to the first value (e.g., $\alpha$=0.65). Alternatively, the system can turn off companding for the fourth frame. Designating the companding exponent value to have a value of 1.0 turns off the companding.

Accordingly, the system may analyze the frames (as non-limiting examples of time segments) of the audio signal to determine, for each frame, whether the respective frame includes a signal of the first to fourth transient types of content. In some implementations, the system may distinguish only between two (or three) transient types of content, such as sparse transient type (first transient type) and dense transient type (second or third transient type). Then, the system may treat frames of respective transient types as belonging to respective sets of frames (e.g., first to fourth sets of frames), and assign a respective companding exponent to each set of frames. For example, the first value of the companding exponent may be assigned to the first set of frames that consists of all those frames that include a first transient type of signal, the second value of the companding exponent may be assigned to the second set of frames that consists of all those frames that include a second transient type of signal, the third value of the companding exponent may be assigned to the third set of frames that consists of all those frames that include a third transient type of signal, and the fourth value of the companding exponent may be assigned to the fourth set of frames that consists of all those frames that include a fourth transient type of signal.

FIG. 11 is a table indicating example values of a companding exponent and corresponding companding status. Conventionally, a one-bit value in a companding control data structure determines whether companding is on or off. If a system determines that companding is on, the system uses a fixed companding exponent value of $\alpha$=0.65. In transient density-based companding as disclosed in this specification, two new companding exponent values $\alpha$=0.5 and $\alpha$=0.35 are used for the second and third types of content as disclosed in reference to FIG. 10. Depending on a number of bits that is used for signaling the companding exponent value between the encoding side and the decoding side, different sets of companding exponents may be used. For instance, if one bit is used to signal the value of the companding exponent, a distinction may be made between sparse transient events and dense transient events (e.g., with a predefined threshold in the density of transient events for delimiting spare and dense transient types from each other). Then, a first value of $\alpha$=0.65 may be used for the sparse transient event frames, and a second value of $\alpha$=0.5 or $\alpha$=0.35 may be used for the dense transient event frames. If two bits are used to signal the value of the companding exponent, it may be distinguished between four different types of frames, using for example the first to fourth values of the companding exponent given above.

Lower value of the companding a corresponds to higher degree of dynamic range compression in the companding (e.g., before core encoding). A value of $\alpha$=1 indicates no companding. Correspondingly, lower value of the companding a corresponds to higher degree of dynamic range expansion in the companding (e.g., after core decoding). Higher degree of dynamic range compression means low intensity signals will be boosted more, and high intensity signals will be attenuated more.

The system can indicate the value of the companding exponent $\alpha$ in a companding control data structure as shown below.

In the data structure, the b_compand_on[ch] includes a two-bit value for a particular

```
companding_control(num_chan)
{
  sync_flag = 0;
  if (num _chan > 1) {
    sync_flag;..................................................  1 bit
  }
  b_need_avg = 0;
  nc = sync_flag ? 1 : num_chan;
  for (ch = 0; ch < nc; ch++) {
    b_compand_on[ch];....................................  2 bit
    if (!b_compand_on[ch]) {
      b_need_avg = 1;
    }
  }
  if(b_need_avg){
    b_compand_avg;.........................................  1 bit
  }
}
``` channel ch. The b_compand_on[ch] can have the binary values of 00, 01, 10, or 11, indicating that for a particular frame, the value of the companding exponent $\alpha$ is 1, 0.65, 0.5, and 0.35, respectively. Other combinations of values are possible.

Figure 12:
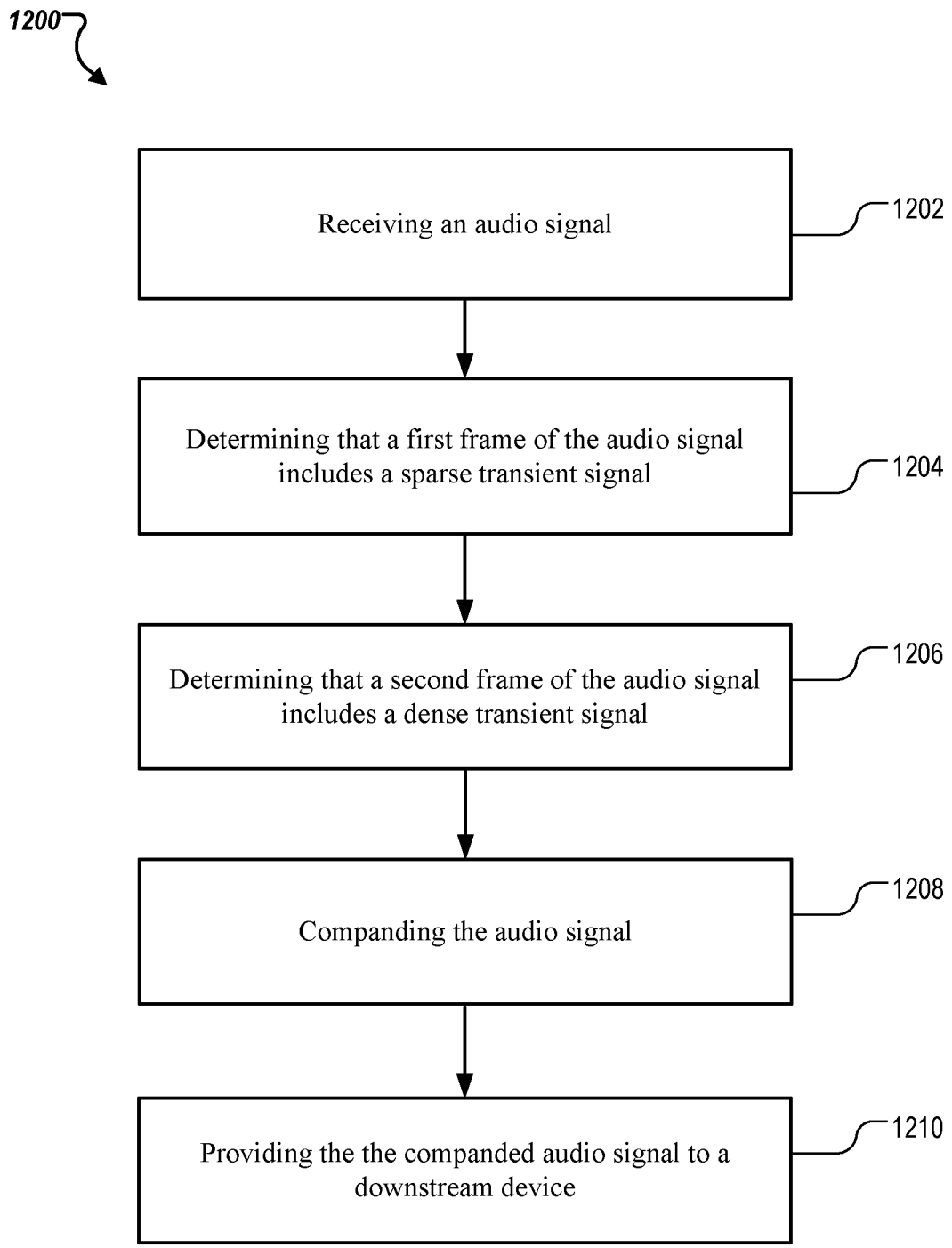
FIG. 12 is a flowchart illustrating a first example process of transient density-based companding.

FIG. 12 is a flowchart illustrating an example process 1200 of transient density-based companding. Process 1200 is an example implementation of techniques described in reference to FIG. 10 and FIG. 11. Process 1200 can be performed by a system including one or more computer processors. The system can be an audio encoder, an audio decoder, or both.

The system receives (1202) an audio signal. The system determines (1204) that a first frame of the audio signal includes a sparse transient signal. The sparse transient signal includes a transient type of the audio signal having a first density of transients. The system determines (1206) that a second frame of the audio signal includes a dense transient signal. The dense transient signal includes a transient type of the audio signal having a second density of transients that is higher than the first density. The transient type of audio signal includes at least one of applause, rain, or crackling fire. In general, the system may, for a time segment (e.g., frame) of the audio signal, analyze the time segment to determine whether the time segment of the audio signal includes a sparse transient signal or a dense transient signal.

The system compands (1208) the audio signal. Companding the audio signal includes applying a companding operation to the audio signal using a companding rule that applies a first companding exponent to the first frame of the audio signal and applies a second companding exponent to the second frame of the audio signal. In general, the system applies companding to the time segment of the audio signal based on a result of the aforementioned determination. This companding of the time segment may comprise compressing or expanding a dynamic range of the time segment of the audio signal based on a companding exponent. A first companding exponent (e.g., $\alpha=0.65$) may be used in the companding if it has been determined that the time segment of the audio signal includes the sparse transient signal, and a second companding exponent different from the first companding exponent (e.g., $\alpha=0.5$ or $\alpha=0.35$) may be used in the companding if it has been determined that the time segment of the audio signal includes the dense transient signal. Each companding exponent is used to derive a respective degree of dynamic range compression and expansion for a corresponding frame. The second companding exponent is lower than the first companding exponent in value and corresponds to a higher degree of dynamic range compression and expansion than that of the first companding exponent. For example, the dynamic range compression may be performed by a scaling of audio samples according to $SC(k)_t = S_t(k)g_t$ for a complex-valued sample $S_t(k)$ at time slot t and frequency band k, where $g_t=(SM_t)^{\alpha-1}$ and is the normalized slot mean (or gain), with $SM_t$ being the mean absolute level (1-norm), given by $SM_t(k)=1/K\Sigma|S_t(k)|$ summed over the range of k=1 to K.

The system provides (1208) the companded audio signal to a downstream device, i.e., outputs the compressed audio signal. The downstream device can be at least one of an encoder, a decoder, an output device, or a storage device.

Figure 13:
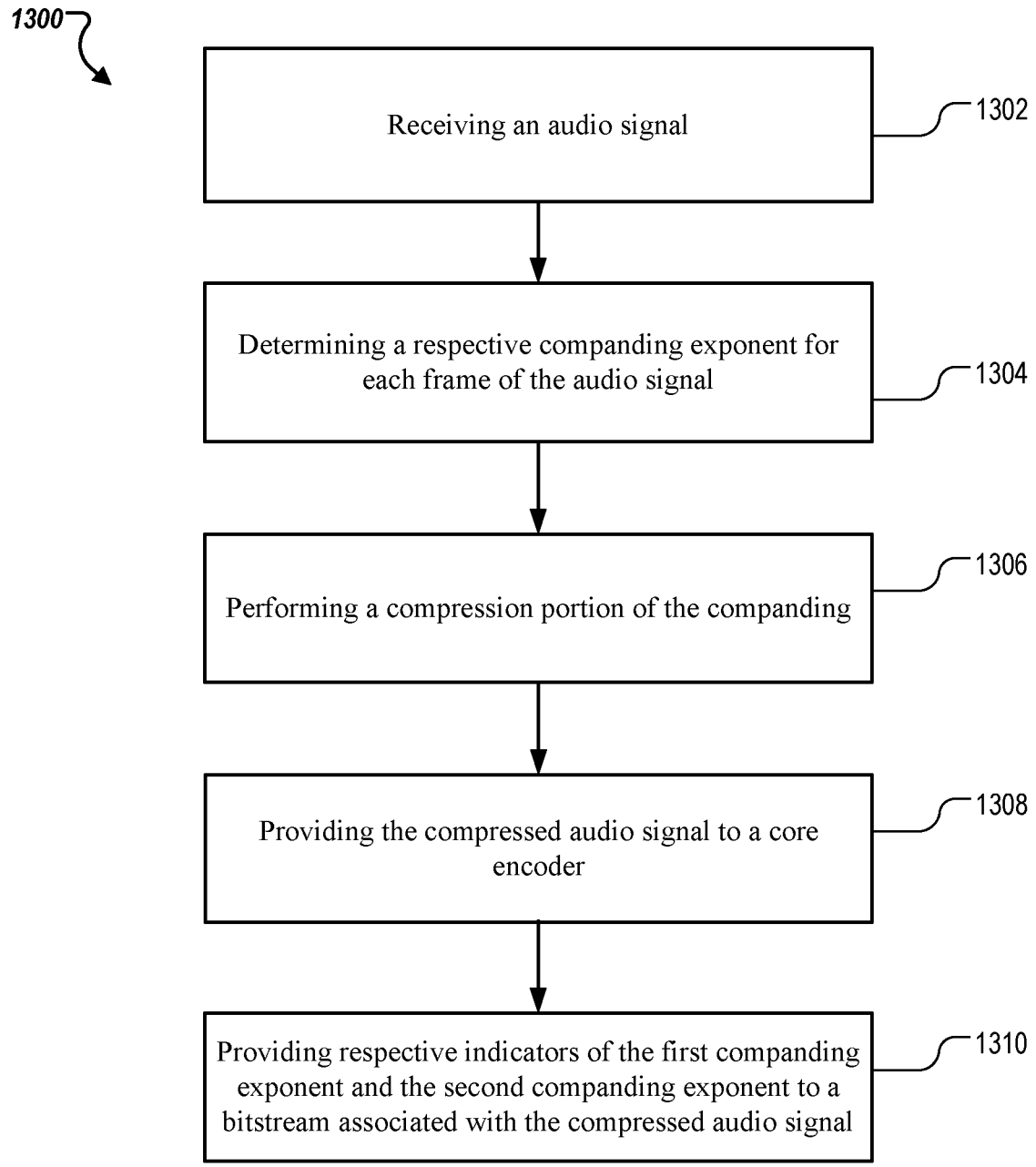
FIG. 13 is a flowchart illustrating a second example process of transient density-based companding.

FIG. 13 is a flowchart illustrating an example process 1300 of transient density-based companding. Process 1300 is an example implementation of techniques described in reference to FIG. 10 and FIG. 11. Process 1300 can be performed by a system including one or more computer processors. The system can include at least one of an audio encoder, an audio decoder, or a companding encoding device. In particular, process 1300 can be performed at the encoding side, in which case the companding may comprise compressing the dynamic range of the audio signal.

The system receives (1302) an audio signal. The audio signal can include a series of frames (as non-limiting examples of time segments).

The system determines (1304) a respective companding exponent for each frame of the audio signal based on content of the audio signal in the corresponding frame. This may involve analyzing the frames of the audio signal, for example with regard to their content. Each companding exponent is used to derive a respective degree of dynamic range compression and expansion of the corresponding frame. Determining the companding exponents includes the following operations. The system designates a first companding exponent for a first frame of the audio signal that is determined to include a sparse transient signal. The system designates a second companding exponent for a second frame of the audio signal that is determined to include a dense transient signal. The first companding exponent being higher in value than the second companding exponent, indicating lower degree of dynamic range compression and expansion. As disclosed above in reference to FIG. 10, the companding exponent controls amount of dynamic range compression used in the companding. A lower value of the companding exponent corresponds to higher dynamic range compression and expansion.

In general, this may correspond to assigning the first companding exponent to a first set of time segments (e.g., frames) that consists of all those time segments of the audio signal that are determined to include a sparse transient signal, and assigning a second companding exponent that is different from the first companding exponent to a second set of time segments (e.g., frames) that consists of all those time segments of the audio signal that are determined to include a dense transient signal.

The sparse transient signal includes a transient type of audio signals having a first density. The dense transient signal includes the transient type of signals having a second density that is higher than the first density. A distinction between sparse transient events and dense transient events may be made based on a predefined threshold for the density of the transients, for example. A measure of the density may be derived using a spectral or temporal peakness of the signal, for example. The transient type of audio signals includes at least one of applause, rain, or crackling fire.

The system performs (1306) a compression portion of the companding (i.e., performs the encoding side part of companding, which corresponds to compressing), including compressing the first frame according to the first companding exponent and compressing the second frame according to the second companding exponent. This may amount to applying a companding operation to the audio signal, including compressing the first set of time segments according to the first companding exponent and compressing the second set of time segments according to the second companding exponent.

The system provides (1308) the compressed audio signal to a core encoder.

The system provides (1310) respective indicators of the first companding exponent and the second companding exponent to a bitstream associated with the compressed audio signal. The indicators can be the values in the companding control data structure described in reference to FIG. 11. Each indicator can include a respective bit of data for each respective channel or respective object in the audio signal, each indicator being stored in a companding control data structure. The total size of an indicator can be a two-bit data structure, where each indicator includes at least two bits of respective companding state data, the at least two bits determining at least four states of companding, each of the four states corresponding a respective type of content.

Figure 14:
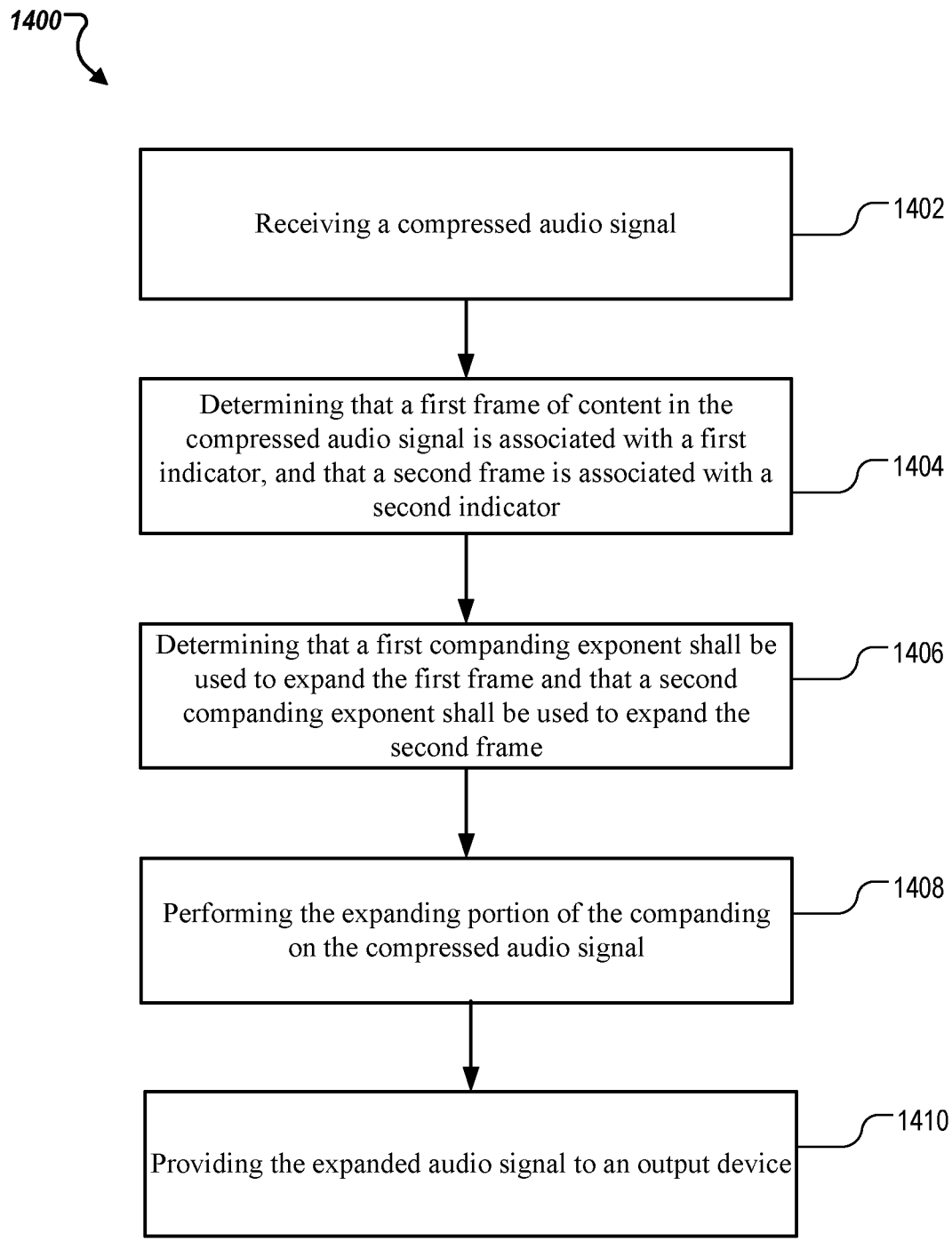
FIG. 14 is a flowchart illustrating a third example process of transient density-based companding.

FIG. 14 is a flowchart illustrating a third example process of transient density-based companding. Process 1400 is an example implementation of techniques described in reference to FIG. 10 and FIG. 11. Process 1400 can be performed by a system including one or more computer processors. The system can include at least one of an audio encoder, an audio decoder, or companding encoding device. In particular, process 1400 can be performed at the decoding side, in which case the companding may comprise expanding the dynamic range of the audio signal.

The system receives (1402) a compressed audio signal that is associated with multiple indicators. Each indicator indicates a respective companding exponent that was used to derive a degree of dynamic range compression applied to a corresponding frame of the compressed audio signal. That is, the system may receive an audio signal together with at least one associated indicator for each time segment of the audio signal, each at least one associated indicator indicating a respective companding exponent corresponding to a degree of compression or expansion that has been applied to the respective time segment of the audio signal during a companding operation prior to encoding.

The system determines (1404) a first frame of content in the compressed audio signal is associated with a first indicator, and that a second frame of the content in the compressed audio signal is associated with a second indicator. Each indicator corresponds to a respective channel or object in the compressed audio signal. Each indicator includes a one-bit value in a companding control data structure in metadata associated with the compressed audio signal. In particular, as described in additional detail in FIG. 11, each indicator includes at least two bits of companding state data configured to indicate various companding exponents. The at least two bits corresponding to at least four states of companding each corresponding to a respective transient type of content. In general, the system may determine a first set of time segments consisting of all those time segments of the audio signal that are associated with the first indicator, and determine a second set of time segments consisting of all those time segments of the audio signal that are associated with the second indicator.

The system determines (1406), based on the first indicator and the second indicator, that a first companding exponent shall be used to expand the first frame of the content and that a second companding exponent shall be used to expand the second frame of the content. In general, the system may determine, for each time segment of the audio signal, a respective companding exponent for use in an expanding operation for the respective time segment. Therein, it may be determined that a first companding exponent shall be used for the first set of time segments and a second companding exponent shall be used for the second set of time segments. The first companding exponent may be different from the second companding exponent.

The system performs (1408) the expanding portion of the companding on the compressed audio signal (i.e., performs the decoding side part of companding, which corresponds to expanding). The operations include expanding the first frame of the content of the compressed audio signal according to a first degree of dynamic range expansion derived from the first companding exponent and expanding the second frame of the content of the compressed audio signal according to a second degree of dynamic range expansion derived from the second companding exponent. In general, the system may apply an expanding operation (decoding-side part of companding) to the audio signal, including expanding the first set of time segments according to a first degree of dynamic range expansion derived from the first companding exponent and expanding the second set of time segments according to a second degree of dynamic range expansion derived from the second companding exponent.

The system provides (1410) the expanded audio signal, for example to an output device. The output device includes at least one of a storage device, a streaming server, an audio processor, or an amplifier.

It is understood that processes 1200 and 1300 may be performed at compression component 104 described above (e.g., at the encoding side). Processes 1200 and 1400 may be performed at expansion component 114 (e.g., at the decoding side).

Notably, while processes 1200, 1300, and 1400 refer to first and second companding exponents, the may likewise be applied to a case in which a distinction is performed between more than two transient types. For example, the aforementioned processes may assign/use first to fourth values of the companding exponent.

Aspects of the systems described herein may be implemented in an appropriate computer-based sound processing network environment for processing digital or digitized audio files. Portions of the adaptive audio system may include one or more networks that comprise any desired number of individual machines, including one or more routers (not shown) that serve to buffer and route the data transmitted among the computers. Such a network may be built on various different network protocols, and may be the Internet, a Wide Area Network (WAN), a Local Area Network (LAN), or any combination thereof.

One or more of the components, blocks, processes or other functional components may be implemented through a computer program that controls execution of a processor-based computing device of the system. It should also be noted that the various functions disclosed herein may be described using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, physical (non-transitory), non-volatile storage media in various forms, such as optical, magnetic or semiconductor storage media.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

Various aspects and implementations of the invention may also be appreciated from the enumerated example embodiments (EEEs) recited below.

EEE 1. A method of processing an audio signal, comprising:
receiving an audio signal;
determining that a first frame of the audio signal includes a sparse transient signal;
determining that a second frame of the audio signal includes a dense transient signal;
companding the audio signal, including applying a compression/expansion (companding) operation to the audio signal using a companding rule that applies a first companding exponent to the first frame of the audio signal and applies a second companding exponent to the second frame of the audio signal, each companding exponent being used to derive a respective degree of dynamic range compression and expansion for a corresponding frame; and
providing the companded audio signal to a downstream device.

EEE 2. The method of EEE 1, wherein the sparse transient signal includes a transient type of the audio signal having a first density of transients, and the dense transient signal includes a transient type of the audio signal having a second density of transients that is higher than the first density, and
wherein the transient type of audio signal includes at least one of applause, rain, or crackling fire.

EEE 3. The method of EEE 1, wherein the second companding exponent is lower than the first companding exponent in value and corresponds to a higher degree of dynamic range compression and expansion than that of the first companding exponent.

EEE 4. A method of processing an audio signal, the method comprising:
receiving, by a compression/expansion (companding) encoding device, an audio signal;
determining, by the companding device, a respective companding exponent for each frame of the audio signal based on content of the audio signal in a corresponding frame, each companding exponent being used to derive a respective degree of dynamic range compression and expansion of the corresponding frame, the determining comprising:
designating a first companding exponent for a first frame of the audio signal that is determined to include a sparse transient signal; and
designating a second companding exponent for a second frame of the audio signal that is determined to include a dense transient signal, the first companding exponent being higher in value than the second companding exponent;
performing a compression portion of the companding, including compressing the first frame according to the first companding exponent and compressing the second frame according to the second companding exponent;
providing the compressed audio signal to a core encoder; and
providing respective indicators of the first companding exponent and the second companding exponent to a bitstream associated with the compressed audio signal.

EEE 5. The method of EEE 4, wherein the companding exponent controls amount of dynamic range compression used in the companding, wherein a lower value of the companding exponent corresponds to higher dynamic range compression.

EEE 6. The method of EEE 4, wherein the sparse transient signal includes a transient type of audio signals having a first density, and the dense transient signal includes the transient type of signals having a second density that is higher than the first density, the transient type of audio signals including at least one of applause, rain, or crackling fire.

EEE7. The method of EEE 4, wherein each indicator includes a respective bit of data for each respective channel or respective object in the audio signal, each indicator being stored in a companding control data structure.

EEE8. The method of EEE 7, wherein each indicator includes a respective second bit of data indicating whether companding is on or off.

EEE9. The method of EEE 8, wherein each indicator includes at least two bits of respective companding state data, the at least two bits determining at least four states of companding, each of the four states corresponding a respective type of content.

EEE10. A method of decoding an audio signal comprising:
receiving, by a decoder device, a compressed audio signal that is associated with a plurality of indicators, each indicator indicating a respective compression/expanding (companding) exponent that was used to derive a degree of dynamic range compression applied to a corresponding frame of the compressed audio signal;
determining that a first frame of content in the compressed audio signal is associated with a first indicator, and that a second frame of the content in the compressed audio signal is associated with a second indicator;
determining, by the decoder device and based on the first indicator and the second indicator, that a first companding exponent shall be used to expand the first frame of the content and that a second companding exponent shall be used to expand the second frame of the content;
performing expanding operation of the companding on the compressed audio signal, including expanding the first frame of the content of the compressed audio signal according to a first degree of dynamic range expansion derived from the first companding exponent and expanding the second frame of the content of the compressed audio signal according to a second degree of dynamic range expansion derived from the second companding exponent; and
providing the expanded audio signal to an output device.

EEE 11. The method of EEE 10, wherein each indicator corresponds to a respective channel or object in the compressed audio signal.

EEE12. The method of EEE 10, wherein each indicator includes a one-bit value in a companding control data structure in metadata associated with the compressed audio signal.

EEE13. The method of EEE 12 wherein each indicator includes at least two bits of companding state data configured to indicate various companding exponents, the at least two bits corresponding to at least four states of companding each corresponding to a respective transient type of content.

EEE14. The method of EEE10, wherein the output device includes at least one of a storage device, a streaming server, an audio processor, or an amplifier.

EEE15. A system comprising:
one or more processors; and
a non-transitory computer-readable storage medium storing instructions that, when executed by the one or more processors, cause the one or more processors to perform operations of any of EEEs 1 through 14.

EEE16. A non-transitory computer-readable storage medium storing instructions that, when executed by one or more processors, cause the one or more processors to perform operations of any of EEEs 1 through 14.

What is claimed is:

1. A method of decoding an audio signal comprising:
receiving an audio signal together with at least one associated indicator for each time segment of the audio signal, each at least one associated indicator indicating a respective companding exponent corresponding to a degree of compression or expansion that has been applied to the respective time segment of the audio signal during a companding operation prior to encoding;
determining a first set of time segments consisting of all those time segments of the audio signal that are associated with a first indicator, and determining a second set of time segments consisting of all those time segments of the audio signal that are associated with a second indicator, wherein each indicator includes a one-bit value in a companding control data structure in metadata associated with the received audio signal, and wherein the first indicator includes a first value indicating that a first companding exponent has been used during companding the time segments in the first set of time segments, wherein the time segments in the first set of time segments include sparse transient signals, and wherein the second indicator includes a second value indicating that a second companding exponent has been used during companding the time segments in the second set of time segments, wherein the time segments in the second set of time segments include dense transient signals;
determining, for each time segment of the audio signal, a respective companding exponent for use in an expanding operation for the respective time segment based on the first indicator and the second indicator, wherein it is determined that the first companding exponent shall be used for the first set of time segments and the second companding exponent shall be used for the second set of time segments, wherein the first companding exponent is different from the second companding exponent;
applying an expanding operation to the audio signal, including expanding the first set of time segments according to a first degree of dynamic range expansion derived from the first companding exponent and expanding the second set of time segments according to a second degree of dynamic range expansion derived from the second companding exponent; and
outputting the expanded audio signal.

2. The method according to claim 1, wherein each indicator corresponds to a respective channel or object in the received audio signal.

3. The method according to claim 1, wherein each indicator includes at least two bits of companding state data configured to indicate various companding exponents, the at least two bits corresponding to at least four states of companding each corresponding to a respective transient type of content of the audio signal.

4. The method according to 1, wherein the expanded audio signal is output to at least one of a storage device, a streaming server, an audio processor, or an amplifier.

5. An apparatus comprising:
one or more processors; and
a non-transitory computer readable storage medium storing instructions that, when executed by the one or more processors, cause the one or more processors to perform operations according to claim 1.

6. A non-transitory computer readable storage medium storing instructions that, when executed by one or more processors, cause the one or more processors to perform operations according to claim 1.

* * * * *

UNITED STATES PATENT AND TRADEMARK OFFICE
CERTIFICATE OF CORRECTION

PATENT NO. : 11,830,507 B2
APPLICATION NO. : 17/270035
DATED : November 28, 2023
INVENTOR(S) : Arijit Biswas It is certified that error appears in the above-identified patent and that said Letters Patent is hereby corrected as shown below:

In the Claims

Column 30, Claim 4, Line 24, delete "according to 1," and insert --according to claim 1,--.

Signed and Sealed this
Tenth Day of December, 2024

Katherine Kelly Vidal
*Director of the United States Patent and Trademark Office*